US012564097B2

(12) United States Patent
Lee et al.

(10) Patent No.: US 12,564,097 B2
(45) Date of Patent: Feb. 24, 2026

(54) STACKED INTEGRATED CIRCUIT

(71) Applicant: SK hynix Inc., Icheon-si (KR)

(72) Inventors: Dong Uk Lee, Icheon-si (KR); Myeong Jae Park, Icheon-si (KR); Chang Kwon Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 620 days.

(21) Appl. No.: 17/893,806

(22) Filed: Aug. 23, 2022

(65) Prior Publication Data

US 2023/0378134 A1      Nov. 23, 2023

(30) Foreign Application Priority Data

May 23, 2022    (KR) ......................... 10-2022-0062933

(51) Int. Cl.
*H01L 25/065* (2023.01)
*H01L 23/00* (2006.01)

(52) U.S. Cl.
CPC .......... *H01L 25/0657* (2013.01); *H01L 24/08* (2013.01); *H01L 2224/08145* (2013.01); *H01L 2225/06541* (2013.01)

(58) Field of Classification Search
CPC ....... H01L 25/0657; H01L 2224/08145; H01L 25/18; H01L 23/50; H01L 24/08; H01L 2225/06541; H01L 2225/06544; H01L 23/5386; H01L 23/5384; H01L 23/481; G11C 7/1096
See application file for complete search history.

(56) References Cited

U.S. PATENT DOCUMENTS

| | | | |
|---|---|---|---|
| 5,268,868 A | 12/1993 | Kajigaya et al. | |
| 7,548,444 B2 | 6/2009 | Matsui et al. | |
| 11,367,732 B2 * | 6/2022 | Lee ......................... | G11C 8/14 |
| 11,764,128 B2 | 9/2023 | Kim et al. | |
| 2008/0111582 A1 | 5/2008 | Matsui et al. | |
| 2013/0049223 A1 | 2/2013 | Nomoto et al. | |
| 2013/0169343 A1 | 7/2013 | Gillingham | |
| 2014/0233292 A1 * | 8/2014 | Kang ...................... | H01L 24/17 |
| | | | 257/737 |
| 2018/0005995 A1 * | 1/2018 | Shibata ................... | H01L 24/00 |
| 2019/0385984 A1 | 12/2019 | Koyanagi | |
| 2020/0098730 A1 | 3/2020 | Keeth | |

(Continued)

FOREIGN PATENT DOCUMENTS

| | | |
|---|---|---|
| KR | 1020120058156 A | 6/2012 |
| KR | 101547389 B1 | 8/2015 |

*Primary Examiner* — Mamadou L Diallo
(74) *Attorney, Agent, or Firm* — WILLIAM PARK AND ASSOCIATES LTD.

(57) ABSTRACT

A stacked integrated circuit includes a first chip including a first through via set and a second through via set that are disposed to be symmetrical to each other in relation to a first rotating axis and including a first input and output (IO) circuit and a second IO circuit that are disposed to be asymmetrical to each other in relation to the first rotating axis and a second chip including a third through via set and a fourth through via set that are disposed to be symmetrical to each other in relation to a second rotating axis and including a third IO circuit and a fourth IO circuit that are disposed to be asymmetrical to each other in relation to the second rotating axis, the second chip being rotated around the second rotating axis and stacked on the first chip.

58 Claims, 21 Drawing Sheets

(56)        References Cited

U.S. PATENT DOCUMENTS

| 2021/0193242 | A1 | 6/2021 | Nishioka |
| 2021/0200625 | A1* | 7/2021 | Park |
| 2021/0233849 | A1* | 7/2021 | Greco ................... H01L 23/481 |
| 2021/0384162 | A1 | 12/2021 | Choi et al. |
| 2022/0084968 | A1 | 3/2022 | Son et al. |
| 2022/0139880 | A1 | 5/2022 | Lee et al. |
| 2024/0047425 | A1 | 2/2024 | Kweon et al. |

\* cited by examiner

STACKED INTEGRATED CIRCUIT

CROSS-REFERENCE TO RELATED APPLICATION

The present application claims priority under 35 U.S.C. § 119(a) to Korean application number 10-2022-0062933, filed in the Korean Intellectual Property Office on May 23, 2022, the entire disclosure of which is incorporated herein by reference.

BACKGROUND

A stacked integrated circuit is recently formed by stacking a plurality of chips bonded together in order to improve a degree of integration. The plurality of chips included in the stacked integrated circuit may transmit data to one another in addition to control signals including commands and addresses through respective through vias.

SUMMARY

To this end, the present disclosure provides a stacked integrated circuit, including: a first chip including a first through via set and a second through via set that are disposed to be symmetrical to each other in relation to a first rotating axis and including a first input and output (IO) circuit and a second IO circuit that are disposed to be asymmetrical to each other in relation to the first rotating axis; and a second chip including a third through via set and a fourth through via set that are disposed to be symmetrical to each other in relation to a second rotating axis and including a third IO circuit and a fourth IO circuit that are disposed to be asymmetrical to each other in relation to the second rotating axis. The second chip is rotated around the second rotating axis and stacked on the first chip.

Furthermore, the present disclosure provides a stacked integrated circuit, including: a first chip including a first through via that is connected to a first front pad and a second through via that is connected to a second front pad and including a first input and output (IO) circuit that is connected to the first front pad; and a second chip including a third through via that is connected to a third front pad and a fourth through via that is connected to a fourth front pad and including a second IO circuit that is connected to the fourth front pad, the first and second chips being bonded together by bonding the first front pad to the third front pad and bonding the second front pad to the fourth front pad.

Furthermore, the present disclosure provides a stacked integrated circuit, including: a first chip including a first through via and a second through via that are disposed to be symmetrical to each other in relation to a first rotating axis and including a first input and output (IO) circuit that is connected to a first front pad to which the first through via is connected; and a second chip including a third through via and a fourth through via that are disposed to be symmetrical to each other in relation to a second rotating axis and including a second IO circuit that is connected to a second front pad to which the third through via is connected. The second chip is rotated around the second rotating axis and stacked on the first chip.

Furthermore, the present disclosure provides a stacked integrated circuit, including: a first chip including a first through via that is connected to a first front pad, a second through via that is connected to a second front pad, and a first input and output (IO) circuit that is connected to the first front pad; and a second chip including a third through via that is connected to a third front pad, a fourth through via that is connected to a fourth front pad, and a second IO circuit that is connected to the fourth front pad. The first through via and the second through via are disposed to be symmetrical to each other based on a rotating axis, the third through via and the fourth through via are disposed to be symmetrical to each other based on the rotating axis, the first front pad and the third front pad are bonded together, and the second front pad and the fourth front pad are bonded together.

Furthermore, the present disclosure provides a stacked integrated circuit, including: a first bonding chip that is formed by stacking a first chip including a first input and output (IO) circuit and a second chip including a second IO circuit; a dummy chip that is stacked on the first bonding chip; and a second bonding chip that is stacked on the dummy chip and formed by stacking a third chip including a third IO circuit and a fourth chip including a fourth IO circuit. The dummy chip includes a dummy via set, a first dummy pad set, and a second dummy pad set, each of which is connected so that each of the first IO circuit, the second IO circuit, the third IO circuit, and the fourth IO circuit is allocated to a separate channel.

Furthermore, the present disclosure provides a stacked integrated circuit, including: a first chip including a first front pad set, a first through via set, a first back pad set, and a first input and output (IO) circuit; a second chip stacked on the first chip and including a second IO circuit; a third chip stacked on the second chip and including a third IO circuit; and a fourth chip stacked on the third chip and including a fourth IO circuit. The second chip includes a second front pad set, a second through via set, and a second back pad set, each of which is connected so that each of the first IO circuit, the second IO circuit, the third IO circuit, and the fourth IO circuit is allocated to a separate channel.

Furthermore, the present disclosure provides a stacked integrated circuit, including: a chip flag module configured to generate a chip flag including information with regard to whether a chip is a lower chip or an upper chip based on a source flag, and an output control module configured to generate a chip ID in a different path based on the chip flag and configured to generate an output control signal to control an output of chip data based on the chip ID, a selection ID, and a read control signal.

Furthermore, the present disclosure provides a stacked integrated circuit, including: a first chip including a first front pad set and a first back pad set and further comprising a first chip ID generation circuit configured to generate a first chip ID in a first path based on a first chip flag; and a second chip including a second front pad set and a second back pad set and further comprising a second chip ID generation circuit configured to generate a second chip ID in a second path based on a second chip flag, the second chip being stacked on the first chip and bonded together by bonding the first front pad set to the second front pad set.

BRIEF DESCRIPTION OF THE DRAWINGS

FIGS. 8 to 10 are side views each illustrating a construction of a stacked integrated circuit according to yet another example of the present disclosure.

FIG. 13 is a side view illustrating a construction of an output control module according to an example of the present disclosure.

DETAILED DESCRIPTION

In the descriptions of the following embodiments, the term "preset" indicates that the numerical value of a parameter is previously decided, when the parameter is used in a process or algorithm. According to an embodiment, the numerical value of the parameter may be set when the process or algorithm is started or while the process or algorithm is performed.

Terms such as "first" and "second," which are used to distinguish among various components, are not limited by the components. For example, a first component may be referred to as a second component, and vice versa.

When one component is referred to as being "coupled" or "connected" to another component, it should be understood that the components may be directly coupled or connected to each other or coupled or connected to each other through another component interposed therebetween. On the other hand, when one component is referred to as being "directly coupled" or "directly connected" to another component, it should be understood that the components are directly coupled or connected to each other without another component interposed therebetween.

A "logic high level" and a "logic low level" are used to describe the logic levels of signals. A signal having "logic high level" is distinguished from a signal having "logic low level." For example, when a signal having a first voltage corresponds to a signal having a "logic high level," a signal having a second voltage may correspond to a signal having a "logic low level." According to an embodiment, a "logic high level" may be set to a voltage higher than a "logic low level." According to an embodiment, the logic levels of signals may be set to different logic levels or opposite logic levels. For example, a signal having a logic high level may be set to have a logic low level according to an embodiment, and a signal having a logic low level may be set to have a logic high level according to an embodiment.

A "logic bit set" may mean a combination of logic levels of bits included in a signal. When a logic level of each of the bits included in the signal is changed, a logic bit set of the signal may be differently set. For example, if two bits are included in a signal, a logic bit set of the signal may be set as a first logic bit set when logic levels of the two bits included in the signal are a "logic low level" and a "logic low level," respectively, and may be set as a second logic bit set when logic levels of the two bits included in the signal are a "logic low level" and a "logic high level," respectively.

Hereafter, the teachings of the present disclosure will be described in more detail through embodiments. The embodiments are only used to exemplify the teachings of the present disclosure, and the scope of the present disclosure is not limited by the embodiments.

Figure 1:
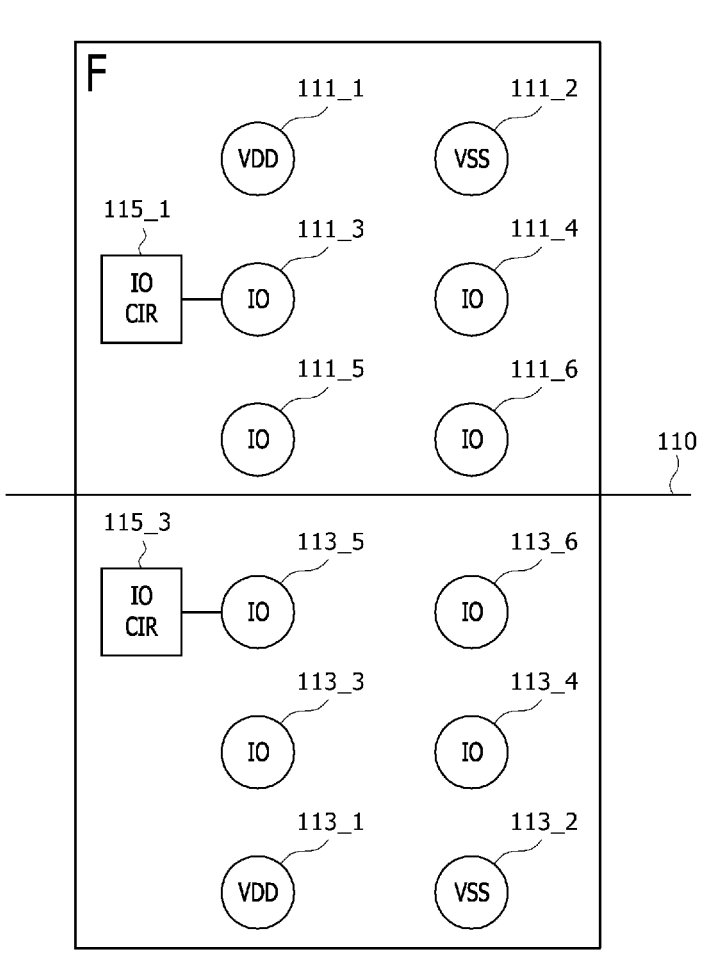
FIGS. 1 to 3 are plan views illustrating constructions of a stacked integrated circuit according to an example of the present disclosure.
Figure 2:
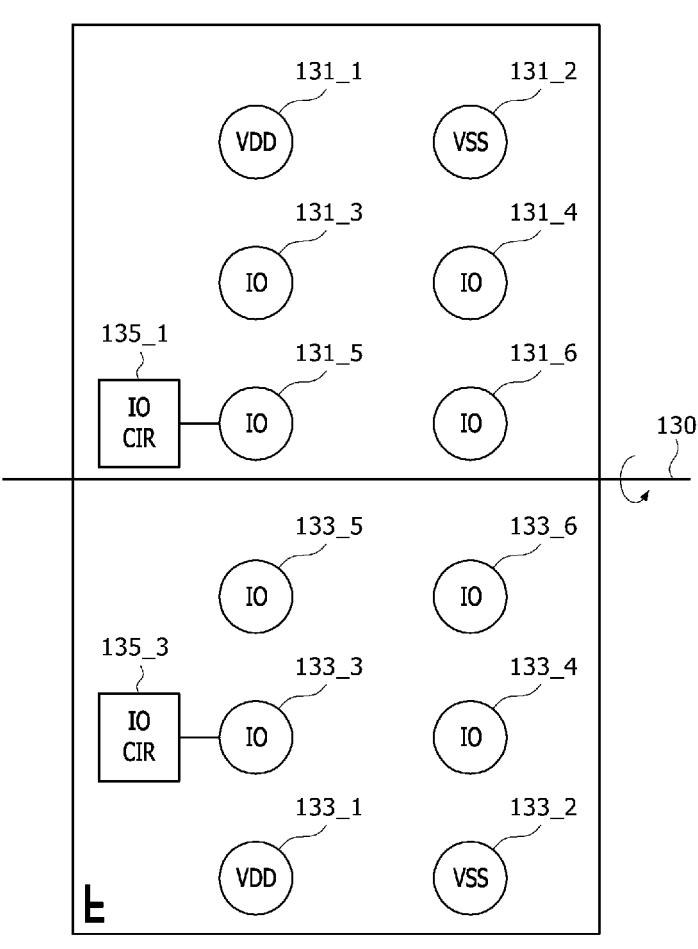
Figure 3:
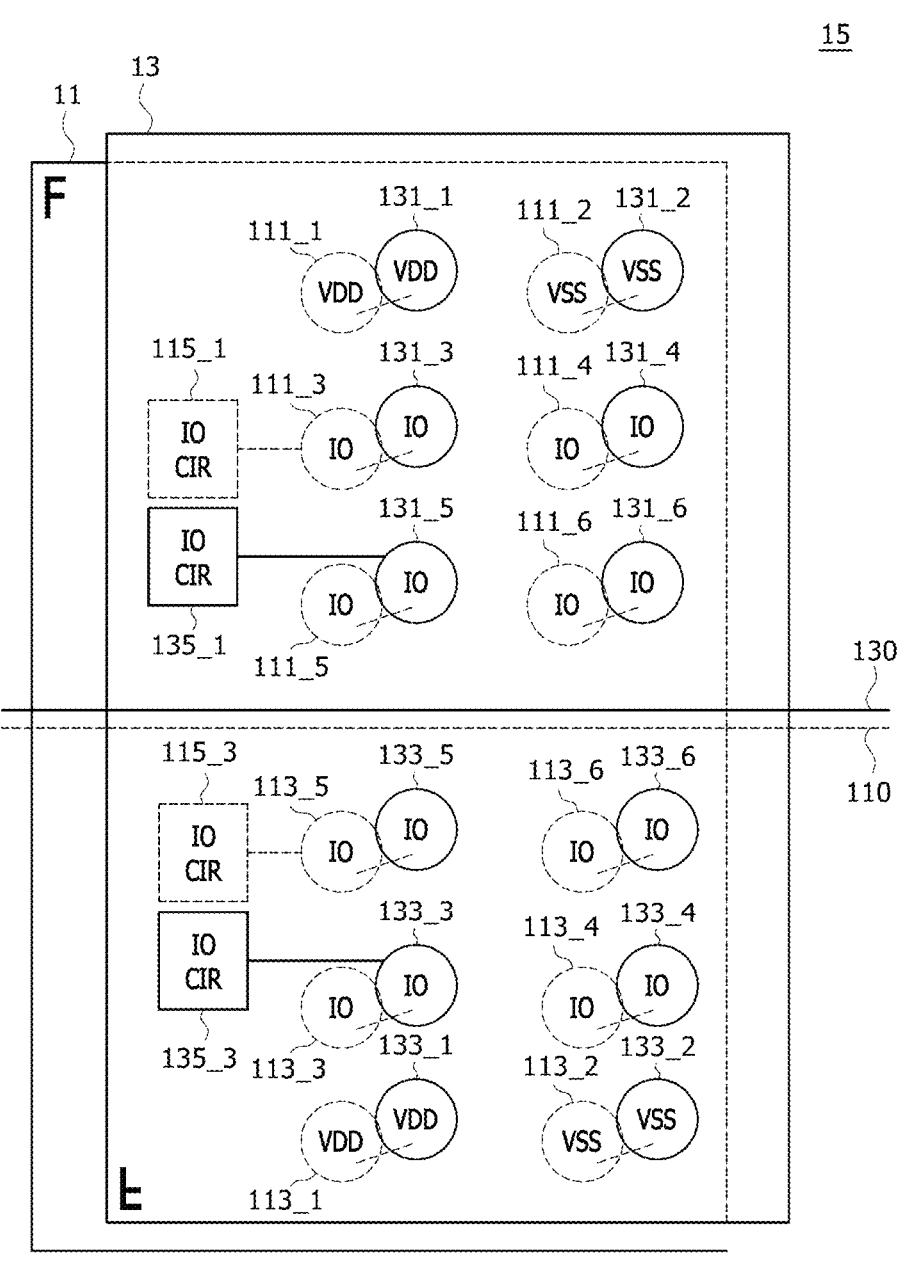

FIGS. 1 to 3 are plan views illustrating constructions of a stacked integrated circuit 15 according to an example of the present disclosure. More specifically, FIG. 1 is a plan view illustrating a construction of a lower chip 11 that is included in the stacked integrated circuit 15. FIG. 2 is a plan view illustrating a construction of an upper chip 13 that is included in the stacked integrated circuit 15. FIG. 3 is a plan view illustrating a construction of the stacked integrated circuit that is formed by stacking the upper chip 13 on the lower chip 11 as a front face to front face bonding structure.

As illustrated in FIG. 1, the lower chip 11 may include a first through via set 111_1 to 111_6 that are disposed above a first rotating axis 110 and a second through via set 113_1 to 113_6 that are disposed below the first rotating axis 110. The first through via set 111_1 to 111_6 may include a through via 111_1 to which a power supply voltage VDD is supplied, a through via 111_2 to which a ground voltage VSS is supplied, and through vias 111_3 to 111_6 through which a control signal or data is input or output. The second through via set 113_1 to 113_6 may include a through via 113_1 to which the power supply voltage VDD is supplied, a through via 113_2 to which the ground voltage VSS is supplied, and through vias 113_3 to 113_6 through which a control signal or data is input or output. The first through via set 111_1 to 111_6 and the second through via set 113_1 to 113_6 may be disposed to be symmetrical to each other in relation to the first rotating axis 110. The lower chip 11 may include a first input and output circuit (IO CIR) 115_1 that is disposed above the first rotating axis 110 and a second IO circuit 115_3 that is disposed below the first rotating axis 110. The first IO circuit 115_1 may be connected to the through via 111_3 that is included in the first through via set 111_1 to 111_6. The second IO circuit 115_3 may be connected to the through via 113_5 that is included in the second through via set 113_1 to 113_6. The first IO circuit 115_1 and the second IO circuit 115_3 may be disposed to be asymmetrical to each other in relation to the first rotating axis 110.

As illustrated in FIG. 2, the upper chip 13 may include a third through via set 133_1 to 133_6 that are disposed below the second rotating axis 130 and a fourth through via set 131_1 to 131_6 that are disposed above the second rotating axis 130. The third through via set 133_1 to 133_6 may include a through via 133_1 to which the power supply voltage VDD is supplied, a through via 133_2 to which the ground voltage VSS is supplied, and through vias 133_3 to 133_6 through which a control signal or data is input or output. The fourth through via set 131_1 to 131_6 may include a through via 131_1 to which the power supply voltage VDD is supplied, a through via 131_2 to which the ground voltage VSS is supplied, and through vias 131_3 to 131_6 through which a control signal or data is input or output. The third through via set 133_1 to 133_6 and the fourth through via set 131_1 to 131_6 may be disposed to be symmetrical to each other in relation to the second rotating axis 130. The upper chip 13 may include a third IO circuit 135_3 that is disposed below the second rotating axis 130 and a fourth IO circuit 135_1 that is disposed above the second rotating axis 130. The third IO circuit 135_3 may be connected to the through via 133_3 that is included in the third through via set 133_1 to 133_6. The fourth IO circuit 135_1 may be connected to the through via 131_5 that is included in the fourth through via set 131_1 to 131_6. The third IO circuit 135_3 and the fourth IO circuit 135_1 may be disposed to be asymmetrical to each other in relation to the second rotating axis 130. The upper chip 13 may be a chip that is formed by using the same method as that of the lower chip 11 but may be formed to be mirror image symmetrical to the lower chip 11.

As illustrated in FIG. 3, the stacked integrated circuit 15 may be a three-dimensional (3-D) stacked integrated circuit that includes the upper chip 13, illustrated in FIG. 2, stacked on the lower chip 11, illustrated in FIG. 1. A method of stacking the upper chip 13 that is mirror image symmetrical to the lower chip 11 may be defined as a front face to front face bonding structure. As the upper chip 13 is stacked on the lower chip 11, the through vias that are included in the first through via set 111_1 to 111_6 that are included in the lower chip 11 may be connected to the through vias that are included in the fourth through via set 131_1 to 131_6 that are included in the upper chip 13, respectively. More specifically, the through via 111_1 of the lower chip 11 to which the power supply voltage VDD is supplied may be connected to the through via 131_1 of the upper chip 13 to which the power supply voltage VDD is supplied. The through via 111_2 of the lower chip 11 to which the ground voltage VSS is supplied may be connected to the through via 131_2 of the upper chip 13 to which the ground voltage VSS is supplied. The through vias 111_3 to 111_6 of the lower chip 11 through which a control signal or data is input or output may be connected to the through vias 131_3 to 131_6 of the upper chip 13 through which a control signal or data is input or output, respectively. The through vias that are included in the second through via set 113_1 to 113_6 that are included in the lower chip 11 may be connected to the through vias that are included in the third through via set 133_1 to 133_6 that are included in the upper chip 13, respectively. More specifically, the through via 113_1 of the lower chip 11 to which the power supply voltage VDD is supplied may be connected to the through via 133_1 of the upper chip 13 to which the power supply voltage VDD is supplied. The through via 113_2 of the lower chip 11 to which the ground voltage VSS is supplied may be connected to the through via 133_2 of the upper chip 13 to which the ground voltage VSS is supplied. The through vias 113_3 to 113_6 of the lower chip 11 through which a control signal or data is input or output may be connected to the through vias 133_3 to 133_6 of the upper chip 13 through which a control signal or data is input or output. The first IO circuit 115_1 may be connected to the through via 111_3 of the lower chip 11. The second IO circuit 115_3 may be connected to the through via 113_5 of the lower chip 11. The third IO circuit 135_3 may be connected to the through via 133_3 of the upper chip 13. The fourth IO circuit 135_1 may be connected to the through via 131_5 of the upper chip 13. Each of the first IO circuit 115_1, the second IO circuit 115_3, the third IO circuit 135_3, and the fourth IO circuit 135_1 may be formed as a separate rank and may input and output data or control signals through a separate channel.

Figure 4:
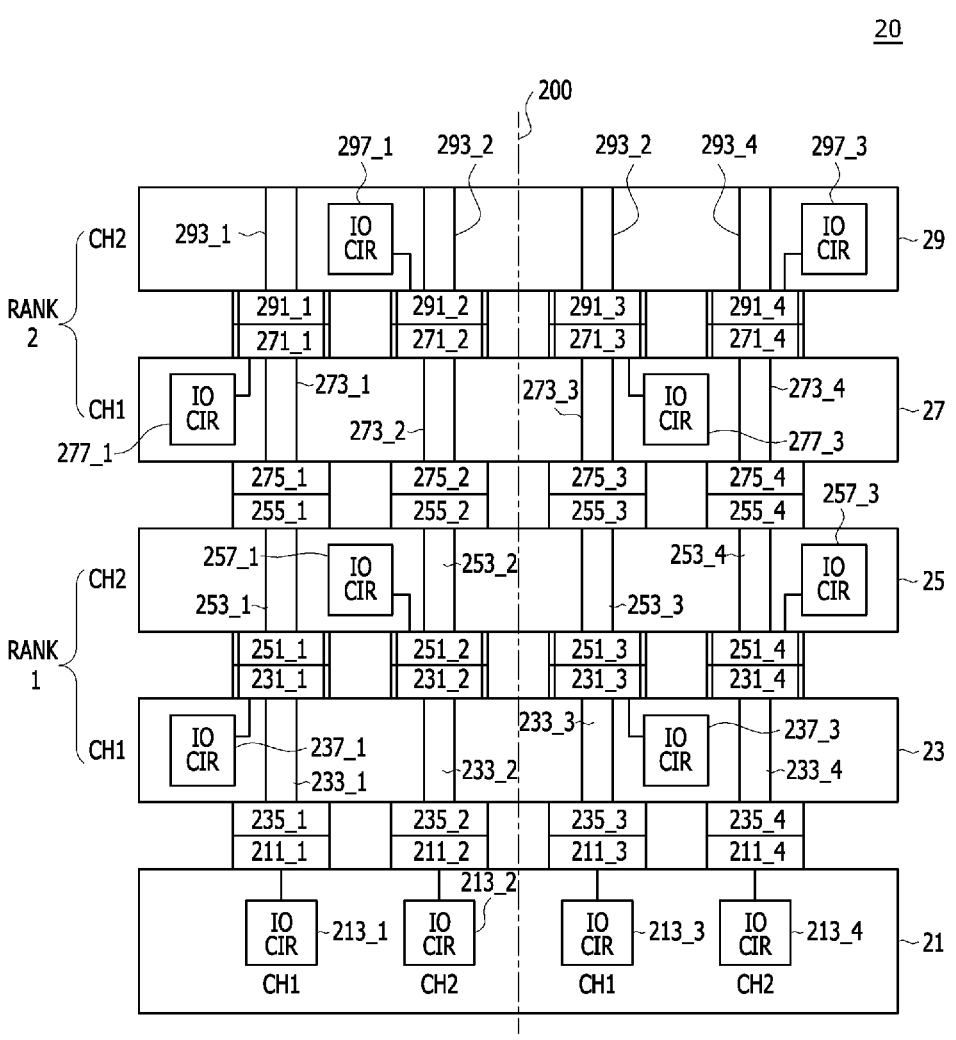
FIG. 4 is a side view illustrating a construction of a stacked integrated circuit according to another example of the present disclosure.

FIG. 4 is a diagram illustrating a construction of a stacked integrated circuit 20 according to another example of the present disclosure. As illustrated in FIG. 4, the stacked integrated circuit 20 may include a base chip 21, a first chip 23, a second chip 25, a third chip 27, and a fourth chip 29.

The base chip 21 may include a first base IO circuit (IO CIR) 213_1, a second base IO circuit 213_2, a third base IO circuit 213_3, and a fourth base IO circuit 213_4. Each of the first base IO circuit 213_1, the second base IO circuit 213_2, the third base IO circuit 213_3, and the fourth base IO circuit 213_4 may be allocated to a separate channel. The first base IO circuit 213_1 may be allocated to a first channel CH1, the second base IO circuit 213_2 may be allocated to a second channel CH2, the third base IO circuit 213_3 may be allocated to a first channel CH1, and the fourth base IO circuit 213_4 may be allocated to a second channel CH2. The base chip 21 may include a base pad set 211_1 to 211_4. The base pads of the base pad set 211_1 to 211_4 may be bonded to the back pads of a first back pad set 235_1 to 235_4 that are included in the first chip 23, respectively.

The first chip 23 may include a first front pad set 231_1 to 231_4, a first through via set 233_1 to 233_4, the first back pad set 235_1 to 235_4, a first IO circuit 237_1, and a second IO circuit 237_3. The front pads of the first front pad set 231_1 to 231_4 may be bonded to the front pads of a second front pad set 251_1 to 251_4 that are included in the second chip 25, respectively. The through vias of the first through via set 233_1 to 233_4 may be connected to the front pads of the first front pad set 231_1 to 231_4, respectively. The through vias of the first through via set 233_1 to 233_4 may be connected to the back pads of the first back pad set 235_1 to 235_4, respectively. The first IO circuit 237_1 may be connected to the front pad 231_1 and may be connected to the first base IO circuit 213_1 that is allocated to the first channel CH1 through the through via 233_1, the back pad 235_1, and the base pad 211_1. The second IO circuit 237_3 may be connected to the front pad 231_3 and may be connected to the third base IO circuit 213_3 that is allocated to the first channel CH1 through the through via 233_3, the back pad 235_3, and the base pad 211_3. The first IO circuit 237_1 and the second IO circuit 237_3 may be formed as a first rank RANK1 and may input and output data or control signals through the first channel CH1.

The second chip 25 may include the second front pad set 251_1 to 251_4, a second through via set 253_1 to 253_4, a second back pad set 255_1 to 255_4, a third IO circuit 257_1, and a fourth IO circuit 257_3. The second chip 25 may be formed to be mirror image symmetrical to the first chip 23 and may be stacked on the first chip 23. The first chip 23 and the second chip 25 may be bonded together as a front face to front face bonding structure and may form a first bonding chip 23 and 25. The first bonding chip 23 and 25 may be formed by using the same method as that of the stacked integrated circuit 15 illustrated in FIG. 3. The through vias of the second through via set 253_1 to 253_4 may be connected to the front pads of the second front pad set 251_1 to 251_4, respectively. The through vias of the second through via set 253_1 to 253_4 may be connected to the back pads of the second back pad set 255_1 to 255_4, respectively. The third IO circuit 257_1 may be connected to the front pad 251_2 and may be connected to the second base IO circuit 213_2 that is allocated to the second channel CH2. The fourth IO circuit 257_3 may be connected to the front pad 251_4 and may be connected to the fourth base IO circuit 213_4 that is allocated to the second channel CH2.

The third IO circuit 257_1 and the fourth IO circuit 257_3 may be formed as the first rank RANK1 and may input and output data or control signals through the second channel CH2. The back pads of the second back pad set 255_1 to 255_4 may be bonded to the back pads of a third back pad set 275_1 to 275_4 that are included in the third chip 27, respectively.

The third chip 27 may include a third front pad set 271_1 to 271_4, a third through via set 273_1 to 273_4, the third back pad set 275_1 to 275_4, a fifth IO circuit 277_1, and a sixth IO circuit 277_3. The front pads of the third front pad set 271_1 to 271_4 may be bonded to the front pads of a fourth front pad set 291_1 to 291_4 that are included in the fourth chip 29, respectively. The through vias of the third through via set 273_1 to 273_4 may be connected to the front pads of the third front pad set 271_1 to 271_4, respectively. The through vias of the third through via set 273_1 to 273_4 may be connected to the back pads of the third back pad set 275_1 to 275_4, respectively. The fifth IO circuit 277_1 may be connected to the front pad 271_1 and may be connected to the first base IO circuit 213_1 that is allocated to the first channel CH1. The sixth IO circuit 277_3 may be connected to the front pad 271_3 and may be connected to the third base IO circuit 213_3 that is allocated to the first channel CH1. The fifth IO circuit 277_1 and the sixth IO circuit 277_3 may be formed as a second rank RANK2 and may input and output data or control signals through the first channel CH1.

The fourth chip 29 may include the fourth front pad set 291_1 to 291_4, a fourth through via set 293_1 to 293_4, a seventh IO circuit 297_1, and an eighth IO circuit 297_3. The fourth chip 29 may be formed to be mirror image symmetrical to the third chip 27 and may be stacked on third chip 27. The third chip 27 and the fourth chip 29 may be bonded together as a front face to front face bonding structure and may form a second bonding chip 27 and 29. The second bonding chip 27 and 29 may be formed by using the same method as that of the stacked integrated circuit 15 illustrated in FIG. 3. The through vias of the fourth through via set 293_1 to 293_4 may be connected to the front pads of the fourth front pad set 291_1 to 291_4, respectively. The seventh IO circuit 297_1 may be connected to the front pad 291_2 and may be connected to the second base IO circuit 213_3 that is allocated to the second channel CH2. The eighth IO circuit 297_3 may be connected to the front pad 291_4 and may be connected to the fourth base IO circuit 213_4 that is allocated to the second channel CH2. The seventh IO circuit 297_1 and the eighth IO circuit 297_3 may be formed as the second rank RANK2 and may input and output data or control signals through the second channel CH2.

The first chip 23 and the second chip 25 that are included in the stacked integrated circuit 20 may be bonded together as a front face to front face bonding structure and may form the first bonding chip 23 and 25. The third chip 27 and the fourth chip 29 that are included in the stacked integrated circuit 20 may be bonded together as a front face to front face bonding structure and may form the second bonding chip 27 and 29. Each of the first chip 23, the second chip 25, the third chip 27, and the fourth chip 29 that is included in the stacked integrated circuit 20 may be formed as a separate rank and may input and output data or control signals through a separate channel. More specifically, the first chip 23 that is included in the stacked integrated circuit 20 may be formed as the first rank RANK1 by the first IO circuit 237_1 and the second IO circuit 237_3 and may input and output data or control signals through the first channel CH1.

Furthermore, the second chip that is included in the stacked integrated circuit 20 may be formed as the first rank RANK1 by the third IO circuit 257_1 and the fourth IO circuit 257_3 and may input and output data or control signals through the second channel CH2. Furthermore, the third chip 27 that is included in the stacked integrated circuit 20 may be formed as the second rank RANK2 by the fifth IO circuit 277_1 and the sixth IO circuit 277_3 and may input and output data or control signals through the first channel CH1. Furthermore, the fourth chip 29 that is included in the stacked integrated circuit 20 may be formed as the second rank RANK2 by the seventh IO circuit 297_1 and the eighth IO circuit 297_3 and may input and output data or control signals through the second channel CH2.

Figure 5:
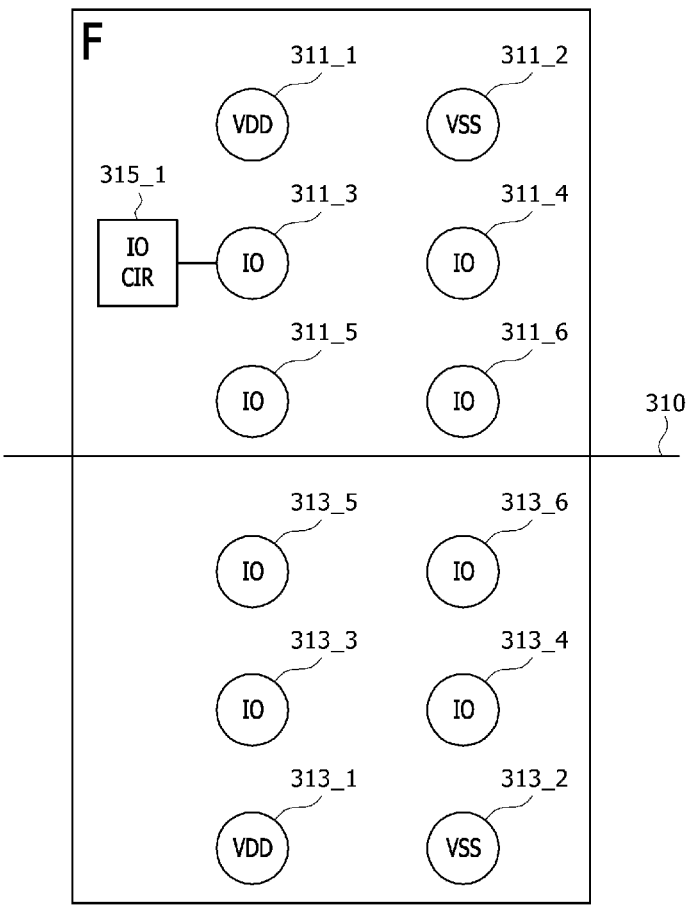
FIGS. 5 to 7 are plan views illustrating constructions of a stacked integrated circuit according to still another example of the present disclosure.

As illustrated in FIG. 5, a lower chip 31 may include a first through via set 311_1 to 311_6 that are disposed above a first rotating axis 310 and a second through via set 313_1 to 313_6 that are disposed below the first rotating axis 310. The first through via set 311_1 to 311_6 may include a through via 311_1 to which a power supply voltage VDD is supplied, a through via 311_2 to which a ground voltage VSS is supplied, and through vias 311_3 to 311_6 through which a control signal or data is input or output. The second through via set 313_1 to 313_6 may include a through via 313_1 to which the power supply voltage VDD is supplied, a through via 313_2 to which to which the ground voltage VSS is supplied, and through vias 313_3 to 313_6 through which a control signal or data is input or output. The first through via set 311_1 to 311_6 and the second through via set 313_1 to 313_6 may be disposed to be symmetrical to each other in relation to the first rotating axis 310. The lower chip 31 may include a first IO circuit (IO CIR) 315_1 that is disposed above the first rotating axis 310. The first IO circuit 315_1 may be connected to the through via 311_3 that is included in the first through via set 311_1 to 311_6.

Figure 6:
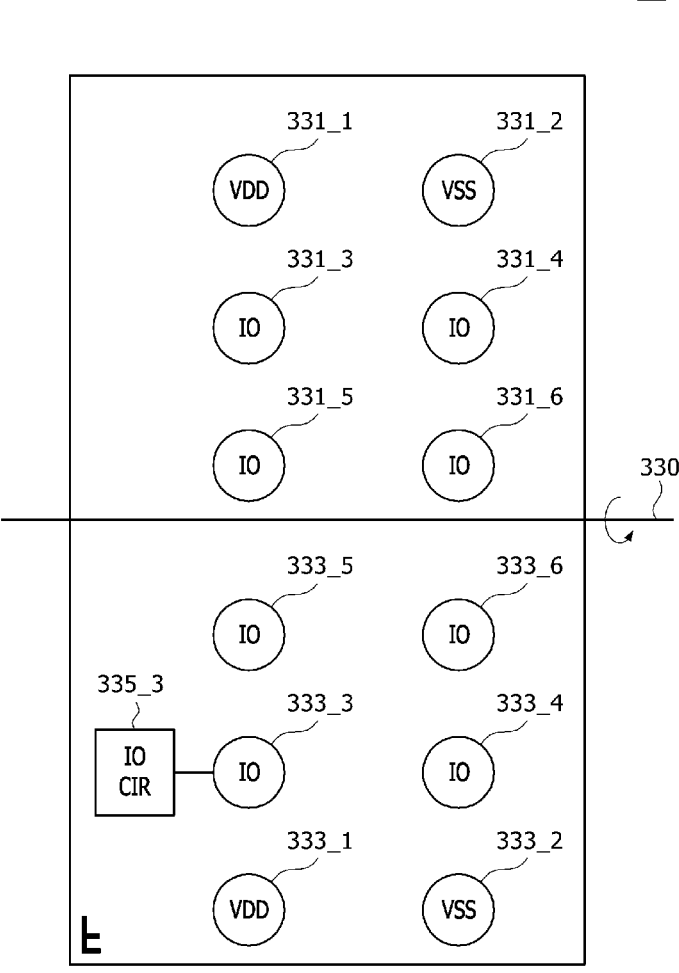

As illustrated in FIG. 6, an upper chip 33 may include a third through via set 333_1 to 333_6 that are disposed below the second rotating axis 330 and a fourth through via set 331_1 to 331_6 that are disposed above the second rotating axis 330. The third through via set 333_1 to 333_6 may include a through via 333_1 to which the power supply voltage VDD is supplied, a through via 333_2 to which the ground voltage VSS is supplied, and through vias 333_3 to 333_6 through which a control signal or data is input or output. The fourth through via set 331_1 to 331_6 may include a through via 331_1 to which the power supply voltage VDD is supplied, a through via 331_2 to which the ground voltage VSS is supplied, and through vias 331_3 to 331_6 through which a control signal or data is input or output. The third through via set 333_1 to 333_6 and the fourth through via set 331_1 to 331_6 may be disposed to be symmetrical to each other in relation to the second rotating axis 330. The upper chip 33 may include a second IO circuit (IO CIR) 335_3 that is disposed below the second rotating axis 330. The second IO circuit 335_3 may be connected to the through via 333_3 that is included in the third through via set 333_1 to 333_6. The upper chip 33 may be a chip that is formed by using the same method as that of the lower chip 31 but may be formed to be mirror image symmetrical to the lower chip 31.

Figure 7:
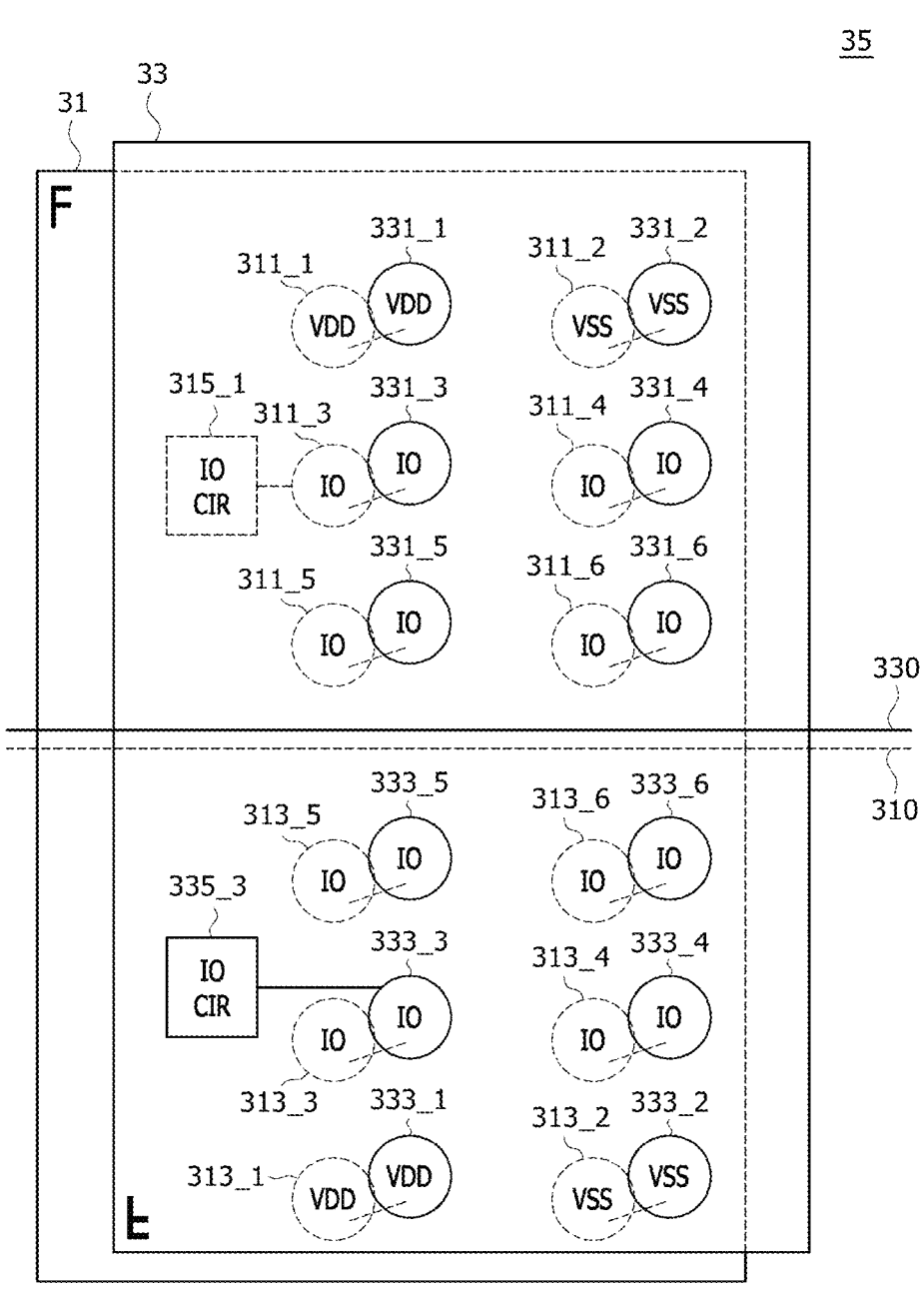

As illustrated in FIG. 7, a stacked integrated circuit 35 may be a 3-D stacked integrated circuit implemented in a way that the upper chip 33 illustrated in FIG. 6 is stacked on the lower chip 31 illustrated in FIG. 5. A method of stacking the upper chip 33, mirror image symmetrical to the lower chip 31, on the lower chip 31 may be defined as a front face to front face bonding structure. As the upper chip 33 is stacked on the lower chip 31, the through vias that are included in the first through via set 311_1 to 311_6 that are included in the lower chip 31 may be connected to the through vias that are included in the fourth through via set 331_1 to 331_6 that are included in the upper chip 33, respectively. More specifically, the through via 311_1 of the lower chip 31 to which the power supply voltage VDD is supplied may be connected to the through via 331_1 of the upper chip 33 to which the power supply voltage VDD is supplied. The through via 311_2 of the lower chip 31 to which the ground voltage VSS is supplied may be connected to the through via 331_2 of the upper chip 33 to which the ground voltage VSS is supplied. The through vias 311_3 to 311_6 of the lower chip 31 through which a control signal or data is input or output may be connected to the through vias 331_3 to 331_6 of the upper chip 33 through which a control signal or data is input or output, respectively. The through vias that are included in the second through via set 313_1 to 313_6 that are included in the lower chip 31 may be connected to the through vias that are included in the third through via set 333_1 to 333_6 that are included in the upper chip 33, respectively. More specifically, the through via 313_1 of the lower chip 31 to which the power supply voltage VDD is supplied may be connected to the through via 333_1 of the upper chip 33 to which the power supply voltage VDD is supplied. The through via 313_2 of the lower chip 31 to which the ground voltage VSS is supplied may be connected to the through via 333_2 of the upper chip 33 to which the ground voltage VSS is supplied. The through vias 313_3 to 313_6 of the lower chip 31 through which a control signal or data is input or output may be connected to the through vias 333_3 to 333_6 of the upper chip 33 through which a control signal or data is input or output, respectively. The first IO circuit 315_1 may be connected to the through via 311_3 of the lower chip 31. The second IO circuit 335_3 may be connected to the through via 333_3 of the upper chip 33. Each of the first IO circuit 315_1, the second IO circuit 115_3, the second IO circuit 335_3, and the fourth IO circuit 135_1 may be formed as a separate rank and may input and output data or control signals through a separate channel.

Figure 8:
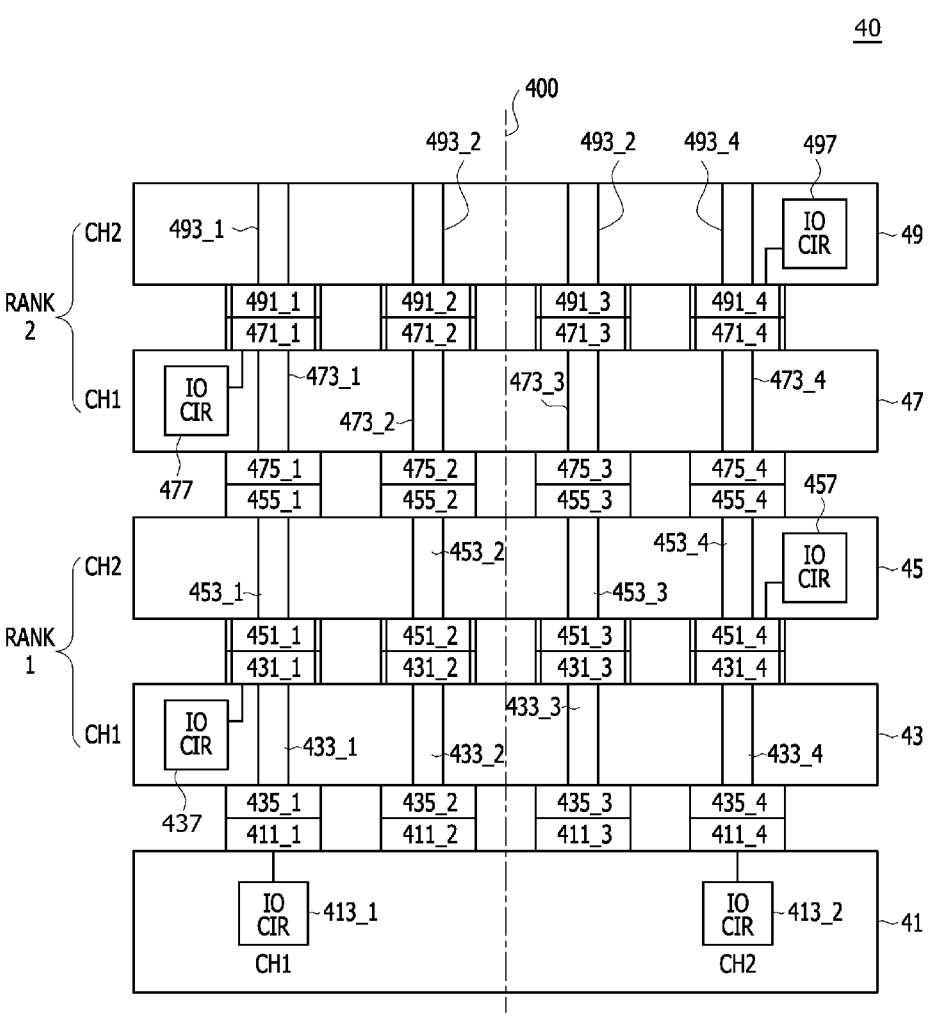

FIG. 8 is a diagram illustrating a construction of a stacked integrated circuit 40 according to another example of the present disclosure. As illustrated in FIG. 8, the stacked integrated circuit 40 may include a base chip 41, a first chip 43, a second chip 45, a third chip 47, and a fourth chip 49.

The base chip 41 may include a first base IO circuit 413_1 and a second base IO circuit 413_2. Each of the first base IO circuit 413_1 and the second base IO circuit 413_2 may be allocated to a separate channel. The first base IO circuit 413_1 may be allocated to a first channel CH1, and the second base IO circuit 413_2 may be allocated to a second channel CH2. The base chip 41 may include a base pad set 411_1 to 411_4. The base pads of the base pad set 411_1 to 411_4 may be bonded to the back pads of a first back pad set 435_1 to 435_4 that are included in the first chip 43, respectively.

The first chip 43 may include a first front pad set 431_1 to 431_4, a first through via set 433_1 to 433_4, the first back pad set 435_1 to 435_4, and a first IO circuit 437. The front pads of the first front pad set 431_1 to 431_4 may be bonded to the front pads of a second front pad set 451_1 to 451_4 that are included in the second chip 45, respectively. The through vias of the first through via set 433_1 to 433_4 may be connected to the front pads of the first front pad set 431_1 to 431_4, respectively. The through vias of the first through via set 433_1 to 433_4 may be connected to the back pads of the first back pad set 435_1 to 435_4, respectively. The first IO circuit 437 may be connected to the front pad 431_1 and may be connected to the first base IO circuit 413_1 that is allocated to the first channel CH1 through the through via 433_1, the back pad 435_1, and the base pad 411_1. The first IO circuit 437 may be formed as a first rank RANK1 and may input and output data or control signals through the first channel CH1.

The second chip 45 may include the second front pad set 451_1 to 451_4, a second through via set 453_1 to 453_4, a second back pad set 455_1 to 455_4, and a second IO circuit 457. The second chip 45 may be formed to be mirror image symmetrical to the first chip 43 based on a rotating axis 400 and may be stacked on the first chip 43. The first chip 43 and the second chip 45 may be bonded together as a front face to front face bonding structure and may form a first bonding chip 43 and 45. The through vias of the second through via set 453_1 to 453_4 may be connected to the front pads of the second front pad set 451_1 to 451_4, respectively. The through vias of the second through via set 453_1 to 453_4 may be connected to the back pads of the second back pad set 455_1 to 455_4, respectively. The second IO circuit 457 may be connected to the front pad 451_4 and may be connected to the second base IO circuit 413_2 that is allocated to the second channel CH2. The second IO circuit 457 may be formed as the first rank RANK1 and may input and output data or control signals through the second channel CH2. The back pads of the second back pad set 455_1 to 455_4 may be bonded to the back pads of a third back pad set 475_1 to 475_4 that are included in the third chip 47, respectively.

The third chip 47 may include a third front pad set 471_1 to 471_4, a third through via set 473_1 to 473_4, the third back pad set 475_1 to 475_4, and a third IO circuit 477. The front pads of the third front pad set 471_1 to 471_4 may be bonded to the front pads of a fourth front pad set 491_1 to 491_4 that are included in the fourth chip 49, respectively. The through vias of the third through via set 473_1 to 473_4 may be connected to the front pads of the third front pad set 471_1 to 471_4, respectively. The through vias of the third through via set 473_1 to 473_4 may be connected to the back pads of the third back pad set 475_1 to 475_4, respectively. The third IO circuit 477 may be connected to the front pad 471_1 and may be connected to the first base IO circuit 413_1 that is allocated to the first channel CH1. The third IO circuit 477 may be formed as a second rank RANK2 and may input and output data or control signals through the first channel CH1.

The fourth chip 49 may include the fourth front pad set 491_1 to 491_4, a fourth through via set 493_1 to 493_4, and a fourth IO circuit 497. The fourth chip 49 may be formed to be mirror image symmetrical to the third chip 47 and may be stacked on the third chip 47. The third chip 47 and the fourth chip 49 may be bonded together as a front face to front face bonding structure and may form a second bonding chip 47 and 49. The through vias of the fourth through via set 493_1 to 493_4 may be connected to the front pads of the fourth front pad set 491_1 to 491_4, respectively. The fourth IO circuit 497 may be connected to the front pad 491_4 and may be connected to the second base IO circuit 413_2 that is allocated to the second channel CH2. The fourth IO circuit 497 may be formed as the second rank RANK2 and may input and output data or control signals through the second channel CH2.

The first chip 43 and the second chip 45 that are included in the stacked integrated circuit 40 may be bonded together as a front face to front face bonding structure and may form the first bonding chip 43 and 45. The third chip 47 and the fourth chip 49 that are included in the stacked integrated circuit 40 may be bonded together as a front face to front face bonding structure and may form the second bonding chip 47 and 49. Each of the first chip 43, the second chip 45, the third chip 47, and the fourth chip 49 that is included in the stacked integrated circuit 40 may be formed as a separate rank and may input and output data or control signals through a separate channel. More specifically, the first chip 43 that is included in the stacked integrated circuit 40 may be formed as the first rank RANK1 by the first IO circuit 437 and may input and output data or control signals through the first channel CH1. Furthermore, the second chip 45 that is included in the stacked integrated circuit 40 may be formed as the first rank RANK1 by the second IO circuit 457 and may input and output data or control signals through the second channel CH2. Furthermore, the third chip 47 that is included in the stacked integrated circuit 40 may be formed as the second rank RANK2 by the third IO circuit 477 and may input and output data or control signals through the first channel CH1. Furthermore, the fourth chip 49 that is included in the stacked integrated circuit 40 may be formed as the second rank RANK2 by the fourth IO circuit 497 and may input and output data or control signals through the second channel CH2.

Figure 9:
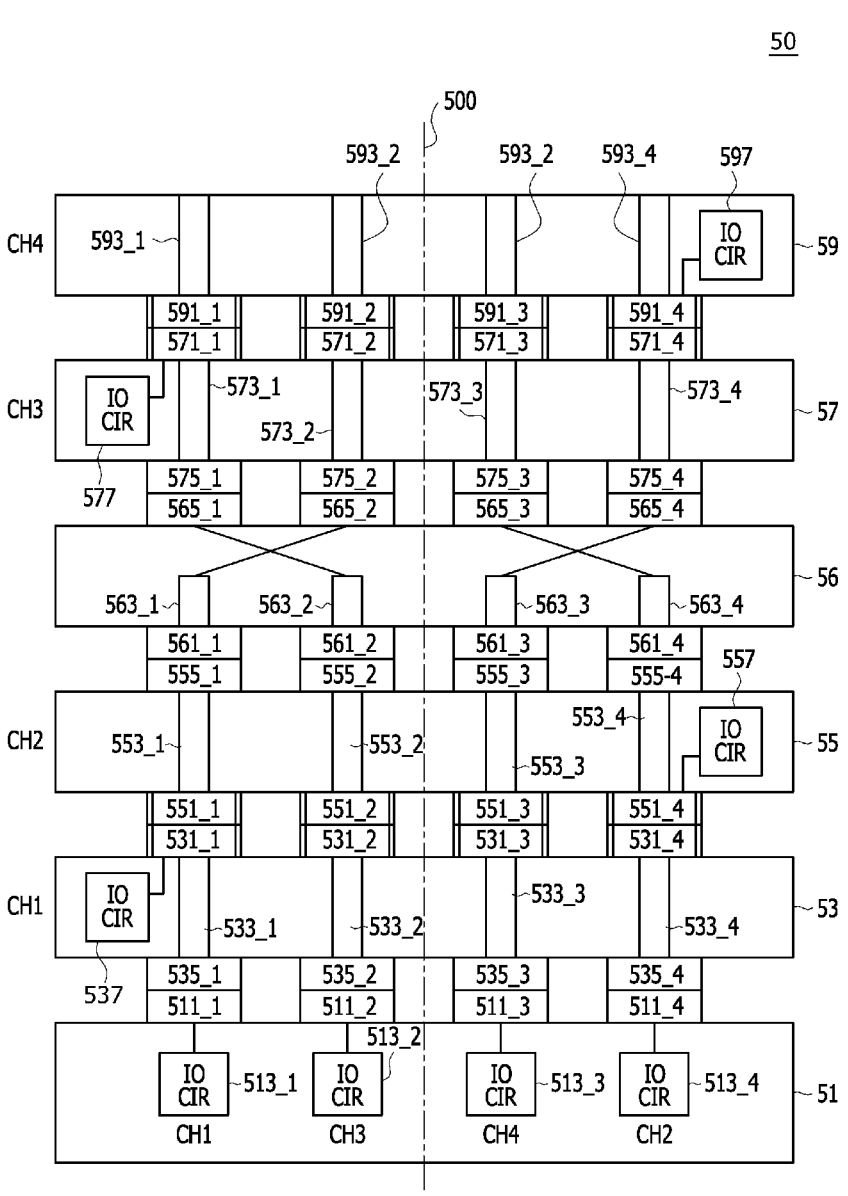

FIG. 9 is a diagram illustrating a construction of a stacked integrated circuit 50 according to another example of the present disclosure. As illustrated in FIG. 9, the stacked integrated circuit 50 may include a base chip 51, a first chip 53, a second chip 55, a dummy chip 56, a third chip 57, and a fourth chip 59.

The base chip 51 may include a first base IO circuit 513_1, a second base IO circuit 513_2, a third base IO circuit 513_3, and a fourth base IO circuit 513_4. Each of the first base IO circuit 513_1, the second base IO circuit 513_2, the third base IO circuit 513_3, and the fourth base IO circuit 513_4 may be allocated to a separate channel. The first base IO circuit 513_1 may be allocated to a first channel CH1, the second base IO circuit 513_2 may be allocated to a third channel CH3, the third base IO circuit 513_3 may be allocated to a fourth channel CH4, and the fourth base IO circuit 513_4 may be allocated to a second channel CH2. The base chip 51 may include a base pad set 511_1 to 511_4. The base pads of the base pad set 511_1 to 511_4 may be bonded to the back pads of a first back pad set 535_1 to 535_4 that are included in the first chip 53, respectively.

The first chip 53 may include a first front pad set 531_1 to 531_4, a first through via set 533_1 to 533_4, the first back pad set 535_1 to 535_4, and a first IO circuit 537. The front pads of the first front pad set 531_1 to 531_4 may be bonded to the front pads of a second front pad set 551_1 to 551_4 that are included in the second chip 55, respectively. The through vias of the first through via set 533_1 to 533_4 may be connected to the front pads of the first front pad set 531_1 to 531_4, respectively. The through vias of the first through via set 533_1 to 533_4 may be connected to the back pads of the first back pad set 535_1 to 535_4, respectively. The first IO circuit 537 may be connected to the front pad 531_1 and may be connected to the first base IO circuit 513_1 that is allocated to the first channel CH1 through the through via 533_1, the back pad 535_1, and the base pad 511_1. The first IO circuit 537 may input and output data or control signals through the first channel CH1.

The second chip 55 may include the second front pad set 551_1 to 551_4, a second through via set 553_1 to 553_4, a second back pad set 555_1 to 555_4, and a second IO circuit 557. The second chip 55 may be formed to be mirror image symmetrical to the first chip 53 based on a rotating axis 500 and may be stacked on the first chip 53. The first chip 53 and the second chip 55 may be bonded together as a front face to front face bonding structure and may form a first bonding chip 53 and 55. The through vias of the second through via set 553_1 to 553_4 may be connected to the front pads of the second front pad set 551_1 to 551_4, respectively. The through vias of the second through via set 553_1 to 553_4 may be connected to the back pads of the second back pad set 555_1 to 555_4, respectively. The second IO circuit 557 may be connected to the front pad 551_4 and may be connected to the fourth base IO circuit 513_4 that is allocated to the second channel CH2. The second IO circuit 557 may input and output data or control signals through the second channel CH2. The back pads of the second back pad set 555_1 to 555_4 may be bonded to the dummy pads of a first dummy pad set 561_1 to 561_4 that are included in the dummy chip 56, respectively.

The dummy chip 56 may include the first dummy pad set 561_1 to 561_4, a dummy via set 563_1 to 563_4, and a second dummy pad set 565_1 to 565_4. The dummy vias of the dummy via set 563_1 to 563_4 may be connected to the dummy pads of the first dummy pad set 561_1 to 561_4, respectively. The dummy vias of the dummy via set 563_1 to 563_4 may be connected to the dummy pads of the second dummy pad set 565_1 to 565_4, respectively. A configuration of the dummy vias of the dummy via set 563_1 to 563_4 being connected to the dummy pads of the second dummy pad set 565_1 to 565_4, respectively, may be different from a configuration of the dummy vias of the dummy via set 563_1 to 563_4 being connected to the dummy pads of the first dummy pad set 561_1 to 561_4, respectively. That is, the dummy vias of the dummy via set 563_1 to 563_4 may be directly connected to the dummy pads of the first dummy pad set 561_1 to 561_4, respectively, whereas the dummy vias of the dummy via set 563_1 to 563_4 may be connected to the dummy pads of the second dummy pad set 565_1 to 565_4, respectively, in a criss-cross manner. The dummy pads of the second dummy pad set 565_1 to 565_4 may be bonded to the back pads of a third back pad set 575_1 to 575_4 that are included in the third chip 57, respectively.

The third chip 57 may include a third front pad set 571_1 to 571_4, a third through via set 573_1 to 573_4, the third back pad set 575_1 to 575_4, and a third IO circuit 577. The front pads of the third front pad set 571_1 to 571_4 may be bonded to the front pads of a fourth front pad set 591_1 to 591_4 that are included in the fourth chip 59, respectively. The through vias of the third through via set 573_1 to 573_4 may be connected to the front pads of the third front pad set 571_1 to 571_4, respectively. The through vias of the third through via set 573_1 to 573_4 may be connected to the back pads of the third back pad set 575_1 to 575_4, respectively. The third IO circuit 577 may be connected to the front pad 571_1 and may be connected to the second base IO circuit 513_2 that is allocated to the third channel CH3 through the dummy via 563_2 of the dummy chip 56. The third IO circuit 577 may input and output data or control signals through the third channel CH3.

The fourth chip 59 may include the fourth front pad set 591_1 to 591_4, a fourth through via set 593_1 to 593_4, and a fourth IO circuit 597. The fourth chip 59 may be formed to be mirror image symmetrical to the third chip 57 and may be stacked on the third chip 57. The third chip 57 and the fourth chip 59 may be bonded together as a front face to front face bonding structure and may form a second bonding chip 57 and 59. The through vias of the fourth through via set 593_1 to 593_4 may be connected to the front pads of the fourth front pad set 591_1 to 591_4, respectively. The fourth IO circuit 597 may be connected to the front pad 591_4 and may be connected to the third base IO circuit 513_3 that is allocated to the fourth channel CH4 through the dummy via 563_3 of the dummy chip 56. The fourth IO circuit 597 may input and output data or control signals through the fourth channel CH4.

The first chip 53 and the second chip 55 that are included in the stacked integrated circuit 50 may be bonded together as a front face to front face bonding structure and may form the first bonding chip 53 and 55. The third chip 57 and the fourth chip 59 that are included in the stacked integrated circuit 50 may be bonded together as a front face to front face bonding structure and may form the second bonding chip 57 and 59. Each of the first chip 53, the second chip 55, the third chip 57, and the fourth chip 59 that is included in the stacked integrated circuit 50 may be formed as a separate rank and may input and output data or control signals through a separate channel. The first chip 53 that is included in the stacked integrated circuit 50 may input and output data or control signals through the first channel CH1 based on the first IO circuit 537. Furthermore, the second chip 55 that is included in the stacked integrated circuit 50 may input and output data or control signals through the second channel CH2 based on the second IO circuit 557. Furthermore, the third chip 57 that is included in the stacked integrated circuit 50 may be connected to the second base IO circuit 513_2 through the dummy via 563_2 of the dummy chip 56 by the third IO circuit 577 and may input and output data or control signals through the third channel CH3. Furthermore, the fourth chip 59 that is included in the stacked integrated circuit 50 may be connected to the third base IO circuit 513_3 through the dummy via 563_3 of the dummy chip 56 by the fourth IO circuit 597 and may input and output data or control signals through the fourth channel CH4.

Figure 10:
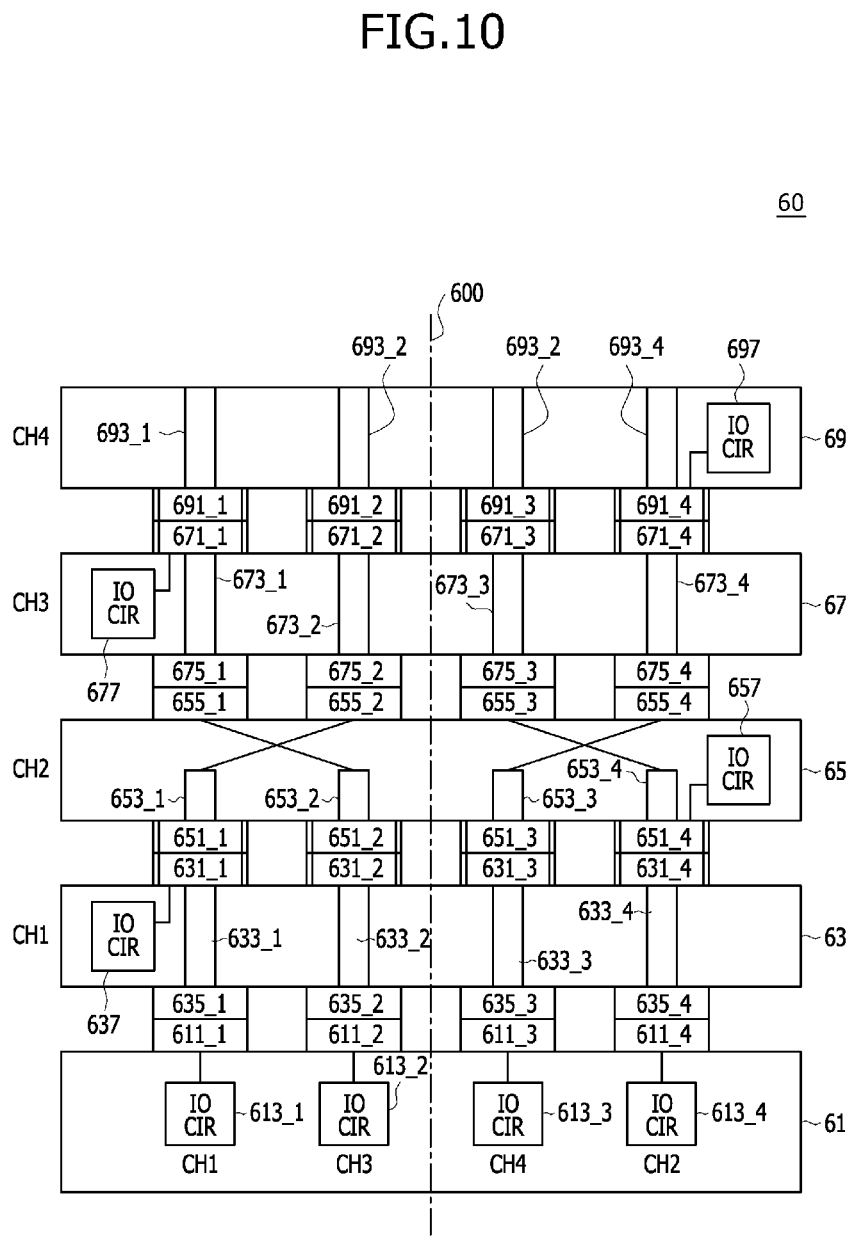

FIG. 10 is a diagram illustrating a construction of a stacked integrated circuit 60 according to another example of the present disclosure. As illustrated in FIG. 10, the stacked integrated circuit 60 may include a base chip 61, a first chip 63, a second chip 65, a third chip 67, and a fourth chip 69.

The base chip 61 may include a first base IO circuit 613_1, a second base IO circuit 613_2, a third base IO circuit 613_3, and a fourth base IO circuit 613_4. Each of the first base IO circuit 613_1, the second base IO circuit 613_2, the third base IO circuit 613_3, and the fourth base IO circuit 613_4 may be allocated to a separate channel. The first base IO circuit 613_1 may be allocated to a first channel CH1, the second base IO circuit 613_2 may be allocated to a third channel CH3, the third base IO circuit 613_3 may be allocated to a fourth channel CH4, and the fourth base IO circuit 613_4 may be allocated to a second channel CH2. The base chip 61 may include a base pad set 611_1 to 611_4. The base pads of the base pad set 611_1 to 611_4 may be bonded to the back pads of a first back pad set 635_1 to 635_4 that are included in the first chip 63, respectively.

The first chip 63 may include a first front pad set 631_1 to 631_4, a first through via set 633_1 to 633_4, the first back pad set 635_1 to 635_4, and a first IO circuit 637. The front pads of the first front pad set 631_1 to 631_4 may be bonded to the front pads of a second front pad set 651_1 to 651_4 that are included in the second chip 65, respectively. The through vias of the first through via set 633_1 to 633_4 may be connected to the front pads of the first front pad set 631_1 to 631_4, respectively. The through vias of the first through via set 633_1 to 633_4 may be connected to the back pads of the first back pad set 635_1 to 635_4, respectively. The first IO circuit 637 may be connected to the front pad 631_1 and may be connected to the first base IO circuit 613_1 that is allocated to the first channel CH1 through the through via 633_1, the back pad 635_1, and the base pad 611_1. The first IO circuit 637 may input and output data or control signals through the first channel CH1.

The second chip 65 may include the second front pad set 651_1 to 651_4, a second through via set 653_1 to 653_4, a second back pad set 655_1 to 655_4, and a second IO circuit 657. The second chip 65 may be formed to be mirror image symmetrical to the first chip 63 and may be stacked on the first chip 63. The first chip 63 and the second chip 65 may be bonded together as a front face to front face bonding structure and may form a first bonding chip 63 and 65. The through vias of the second through via set 653_1 to 653_4 may be connected to the front pads of the second front pad set 651_1 to 651_4, respectively. The through vias of the second through via set 653_1 to 653_4 may be connected to the back pads of the second back pad set 655_1 to 655_4, respectively. A method of the through vias of the second through via set 653_1 to 653_4 being connected to the back pads of the second back pad set 655_1 to 655_4, respectively, may be configured differently from a method of the through vias of the second through via set 653_1 to 653_4 being connected to the front pads of the second front pad set 651_1 to 651_4, respectively. That is, the through vias of the second through via set 653_1 to 653_4 are directly connected to the front pads of the second front pad set 651_1 to 651_4, respectively, whereas the through vias of the second through via set 653_1 to 653_4 are connected to the back pads of the second back pad set 655_1 to 655_4, respectively, in a cross manner. The second IO circuit 657 may be connected to the front pad 651_4 and may be connected to the fourth base IO circuit 613_4 that is allocated to the second channel CH2. The second IO circuit 657 may input and output data or control signals through the second channel CH2. The back pads of the second back pad set 655_1 to 655_4 may be bonded to the back pads of a third back pad set 675_1 to 675_4 that are included in the third chip 67, respectively.

The third chip 67 may include a third front pad set 671_1 to 671_4, a third through via set 673_1 to 673_4, the third back pad set 675_1 to 675_4, and a third IO circuit 677. The front pads of the third front pad set 671_1 to 671_4 may be bonded to the front pads of a fourth front pad set 691_1 to 691_4 that are included in the fourth chip 69, respectively. The through vias of the third through via set 673_1 to 673_4 may be connected to the front pads of the third front pad set 671_1 to 671_4, respectively. The through vias of the third through via set 673_1 to 673_4 may be connected to the back pads of the third back pad set 675_1 to 675_4, respectively. The third IO circuit 677 may be connected to the front pad 671_1 and may be connected to the second base IO circuit 613_2 that is allocated to the third channel CH3 through the through via 653_2 of the second chip 65. The third IO circuit 677 may input and output data or control signals through the third channel CH3.

The fourth chip 69 may include the fourth front pad set 691_1 to 691_4, a fourth through via set 693_1 to 693_4, and a fourth IO circuit 697. The fourth chip 69 may be formed to be mirror image symmetrical to the third chip 67 and may be stacked on the third chip 67. The third chip 67 and the fourth chip 69 may be bonded together as a front face to front face bonding structure and may form a second bonding chip 67 and 69. The through vias of the fourth through via set 693_1 to 693_4 may be connected to the front pads of the fourth front pad set 691_1 to 691_4, respectively. The fourth IO circuit 697 may be connected to the front pad 671_4 and may be connected to the third base IO circuit 613_3 that is allocated to the fourth channel CH4 through the through via 653_3 of the second chip 65. The fourth IO circuit 697 may input and output data or control signals through the fourth channel CH4.

The first chip 63 and the second chip 65 that are included in the stacked integrated circuit 60 may be bonded together as a front face to front face bonding structure and may form the first bonding chip 63 and 65. The third chip 67 and the fourth chip 69 that are included in the stacked integrated circuit 60 may be bonded together as a front face to front face bonding structure and may form the second bonding chip 67 and 69. Each of the first chip 63, the second chip 65, the third chip 67, and the fourth chip 69 that is included in the stacked integrated circuit 60 may be formed as a separate rank and may input and output data or control signals through a separate channel. The first chip 63 that is included in the stacked integrated circuit 60 may input and output data or control signals through the first channel CH1 based on the first IO circuit 637. Furthermore, the second chip 65 that is included in the stacked integrated circuit 60 may input and output data or control signals through the second channel CH2 based on the second IO circuit 657. Furthermore, the third chip 67 that is included in the stacked integrated circuit 60 may be connected to the second base IO circuit 613_2 through the through via 653_2 of the second chip 65 by the third IO circuit 677 and may input and output data or control signals through the third channel CH3. Furthermore, the fourth chip 69 that is included in the stacked integrated circuit 60 may be connected to the third base IO circuit 613_3 through the through via 653_3 of the second chip 65 by the fourth IO circuit 697 and may input and output data or control signals through the fourth channel CH4.

Figure 11:
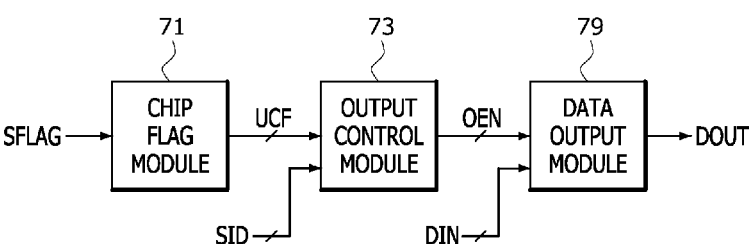
FIG. 11 is a block diagram illustrating a construction of a stacked integrated circuit according to still yet another example of the present disclosure.

FIG. 11 is a block diagram illustrating a construction of a stacked integrated circuit 7 according to still another example of the present disclosure. As illustrated in FIG. 11, the stacked integrated circuit 7 may include a chip flag module 71, an output control module 73, and a data output module 79.

The chip flag module 71 may generate a chip flag UCF including information on whether a chip is a lower chip or an upper chip based on a source flag SFLAG. The source flag SFLAG may be received from an external device of the stacked integrated circuit 7. The external device of the stacked integrated circuit 7 may be implemented as one of a memory controller (1002 in FIG. 20), a controller (2300 in FIG. 21), and a test device. The source flag SFLAG may be configured to be generated to a preset logic level when a preset operation is performed. The preset operation may include a read operation of outputting data or a control signal, a write operation of inputting data or a control signal, an operation of generating a chip ID, etc. In the present embodiment, the preset logic level of the source flag SFLAG may be set to a logic high level, but this is merely an embodiment and the present disclosure is not limited thereto. The chip flag module 71 may be included in each of the lower chips (11 in FIGS. 1 and 3, 23 and 27 in FIGS. 4, 43 and 47 in FIGS. 8, 53 and 57 in FIGS. 9, and 63 and 67 in FIG. 10) and may generate, from the source flag SFLAG, the chip flag UCF including information regarding the lower chip. For example, the chip flag module 71 that is included in each of the lower chips (11 in FIGS. 1 and 3, 23 and 27 in FIGS. 4, 43 and 47 in FIGS. 8, 53 and 57 in FIGS. 9, and 63 and 67 in FIG. 10) may generate the chip flag UCF that is set as a logic low level by receiving the source flag SFLAG that has been inverted and buffered. The chip flag module 71 may be included in each of the upper chips (13 in FIGS. 2 and 3, 25 and 29 in FIGS. 4, 45 and 49 in FIGS. 8, 55 and 59 in FIGS. 9, and 65 and 69 in FIG. 10) and may generate, from the source flag SFLAG, the chip flag UCF including information with regard to the upper chip. For example, the chip flag module 71 that is included in each of the upper chips (13 in FIGS. 2 and 3, 25 and 29 in FIGS. 4, 45 and 49 in FIGS. 8, 55 and 59 in FIGS. 9, and 65 and 69 in FIG. 10) may generate the chip flag UCF that is set as a logic high level by receiving the source flag SFLAG.

The output control module 73 may receive the chip flag UCF from the chip flag module 71 and may receive a selection ID SID from the external device of the stacked integrated circuit 7. The selection ID SID may be configured to be generated to a preset logic bit set when a preset operation is performed. The selection ID SID may include multiple bits. All bits that are included in a preset logic bit set of the selection ID SID may be set to a logic low level, but this is merely an embodiment and the present disclosure is not limited thereto. The output control module 73 may generate an output control signal OEN based on the chip flag UCF and the selection ID SID. The output control module 73 may generate a chip ID (CID1 or CID3 in FIG. 13) through a first path determined based on the chip flag UCF in each of the lower chips (11 in FIGS. 1 and 3, 23 and 27 in FIGS. 4, 43 and 47 in FIGS. 8, 53 and 57 in FIGS. 9, and 63 and 67 in FIG. 10). The output control module 73 may generate a chip ID (CID2 or CID4 in FIG. 13) through a second path that is determined based on the chip flag UCF in each of the upper chips (13 in FIGS. 2 and 3, 25 and 29 in FIGS. 4, 45 and 49 in FIGS. 8, 55 and 59 in FIGS. 9, and 65 and 69 in FIG. 10). The output control module 73 may generate the output control signal OEN that determines, based on each of the lower chips (23 and 27 in FIGS. 4, 43 and 47 in FIGS. 8, 53 and 57 in FIGS. 9, and 63 and 67 in FIG. 10), whether to output internal data DIN in a read operation by comparing the chip ID (CID1 or CID3 in FIG. 13) and the selection ID SID. The output control module 73 may generate the output control signal OEN that determines, based on each of the upper chips (13 in FIGS. 2 and 3, 25 and 29 in FIGS. 4, 45 and 49 in FIGS. 8, 55 and 59 in FIGS. 9, and 65 and 69 in FIG. 10), whether to output the internal data DIN in a read operation by comparing the chip ID (CID2 or CID4 in FIG. 13) and the selection ID SID.

The data output module 79 may receive the output control signal OEN from the output control module 73. The data output module 79 may control whether to output, as output data DOUT, the internal data DIN that is output by a memory cell array (not illustrated) after the start of a read operation based on the output control signal OEN.

Figure 12:
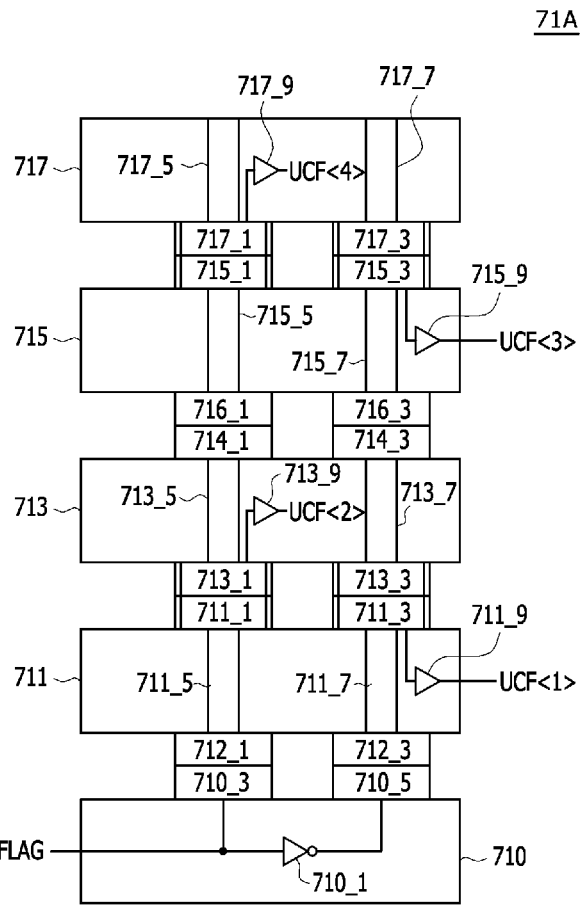
FIG. 12 is a side view illustrating a construction of a chip flag module according to an example of the present disclosure.

FIG. 12 is a diagram illustrating a construction of a chip flag module 71A according to an example of the present disclosure. As illustrated in FIG. 12, the chip flag module 71A may include a source flag reception module 710, a first chip flag module 711, a second chip flag module 713, a third chip flag module 715, and a fourth chip flag module 717.

The source flag reception module 710 may include an inverter 710_1 and a source flag pad set 710_3 and 710_5. The inverter 710_1 may output the source flag SFLAG by inverting and buffering the source flag SFLAG. The source flag reception module 710 may receive the source flag SFLAG and may output the source flag SFLAG or the source flag SFLAG, inverted and buffered through the inverter 710_1, to the source flag pad set 710_3 and 710_5. The source flag pads of the source flag pad set 710_3 and 710_5 may be bonded to the back flag pads of a first back flag pad set 712_1 and 712_3 that are included in the first chip flag module 711, respectively. The source flag reception module 710 may deliver the source flag SFLAG to the first chip flag module 711 through the source flag pad 710_3 and the back flag pad 712_1. The source flag reception module 710 may deliver the source flag SFLAG, inverted and buffered through the inverter 710_1, to the first chip flag module 711 through the source flag pad 710_5 and the back flag pad 712_3. The source flag reception module 710 may be included in the base chip (21 in FIG. 4, 41 in FIG. 8, 51 in FIG. 9, or 61 FIG. 10).

The first chip flag module 711 may include a first front flag pad set 711_1 and 711_3, a first flag through via set 711_5 and 711_7, a first flag driver 711_9, and the first back flag pad set 712_1 and 712_3. The front flag pads of the first front flag pad set 711_1 and 711_3 may be bonded to the front flag pads of a second front flag pad set 713_1 and 713_3 that are included in the second chip flag module 713, respectively. Flag through vias that are included in the first flag through via set 711_5 and 711_7 may be connected to the front flag pads of the first front flag pad set 711_1 and 711_3, respectively. The flag through vias that are included in the first flag through via set 711_5 and 711_7 may be connected to the back flag pads of the first back flag pad set 712_1 and 712_3, respectively. The first flag driver 711_9 may be connected to the front flag pad 711_3 and may drive a first bit UCF<1> of the chip flag UCF based on the inverted-buffered source flag SFLAG. For example, when the source flag SFLAG is set to a logic high level, the first flag driver 711_9 may generate the first bit UCF<1> of the chip flag UCF driven to a logic low level. The first chip flag module 711 may be included in the first chip (23 in FIG. 4, 43 in FIG. 8, 53 in FIG. 9, or 63 in FIG. 10).

The second chip flag module 713 may include the second front flag pad set 713_1 and 713_3, a second flag through via set 713_5 and 713_7, a second flag driver 713_9, and a second back flag pad set 714_1 and 714_3. Flag through vias that are included in the first flag through via set 711_5 and 711_7 may be connected to the front flag pads of the second front flag pad set 713_1 and 713_3, respectively. Flag through vias that are included in the second flag through via set 713_5 and 713_7 may be connected to the back flag pads of the second back flag pad set 714_1 and 714_3, respectively. The second flag driver 713_9 may be connected to the front flag pad 713_1 and may drive a second bit UCF<2> of the chip flag UCF based on the source flag SFLAG. For example, when the source flag SFLAG is set to a logic high level, the second flag driver 713_9 may generate the second bit UCF<2> of the chip flag UCF driven in the logic high level. The back flag pads of the second back flag pad set 714_1 and 714_3 may be bonded to the back flag pads of a third back flag pad set 716_1 and 716_3 that are included in the third chip flag module 715, respectively. The second chip flag module 713 may be included in the second chip (25 in FIG. 4, 45 in FIG. 8, 55 in FIG. 9, or 65 in FIG. 10).

The third chip flag module 715 may include a third front flag pad set 715_1 and 715_3, a third flag through via set 715_5 and 715_7, a third flag driver 715_9, and the third back flag pad set 716_1 and 716_3. The front flag pads of the third front flag pad set 715_1 and 715_3 may be bonded to the front flag pads of a fourth front flag pad set 717_1 and 717_3 that are included in the fourth chip flag module 717, respectively. Flag through vias that are included in the third flag through via set 715_5 and 715_7 may be connected to the front flag pads of the third front flag pad set 715_1 and 715_3, respectively. The flag through vias that are included in the third flag through via set 715_5 and 715_7 may be connected to the back flag pads of the third back flag pad set 716_1 and 716_3, respectively. The third flag driver 715_9 may be connected to the front flag pad 715_3 and may drive a third bit UCF<3> of the chip flag UCF based on the inverted-buffered source flag SFLAG. For example, when the source flag SFLAG is set to a logic high level, the third flag driver 715_9 may generate the third bit UCF<3> of the chip flag UCF driven in the logic low level. The third chip flag module 715 may be included in the third chip (27 in FIG. 4, 47 in FIG. 8, 57 in FIG. 9, or 67 in FIG. 10).

The fourth chip flag module 717 may include the fourth front flag pad set 717_1 and 717_3, a fourth flag through via set 717_5 and 717_7, and a fourth flag driver 717_9. Flag through vias that are included in the fourth flag through via set 717_5 and 717_7 may be connected to the front flag pads of the fourth front flag pad set 717_1 and 717_3, respectively. The fourth flag driver 717_9 may be connected to the front flag pad 717_1 and may drive a fourth bit UCF<4> of the chip flag UCF based on the source flag SFLAG. For example, when the source flag SFLAG is set to a logic high level, the fourth flag driver 717_9 may generate the fourth bit UCF<4> of the chip flag UCF that is driven to the logic high level. The fourth chip flag module 717 may be included in the fourth chip (29 in FIG. 4, 49 in FIG. 8, 59 in FIG. 9, or 69 in FIG. 10).

Figure 13:
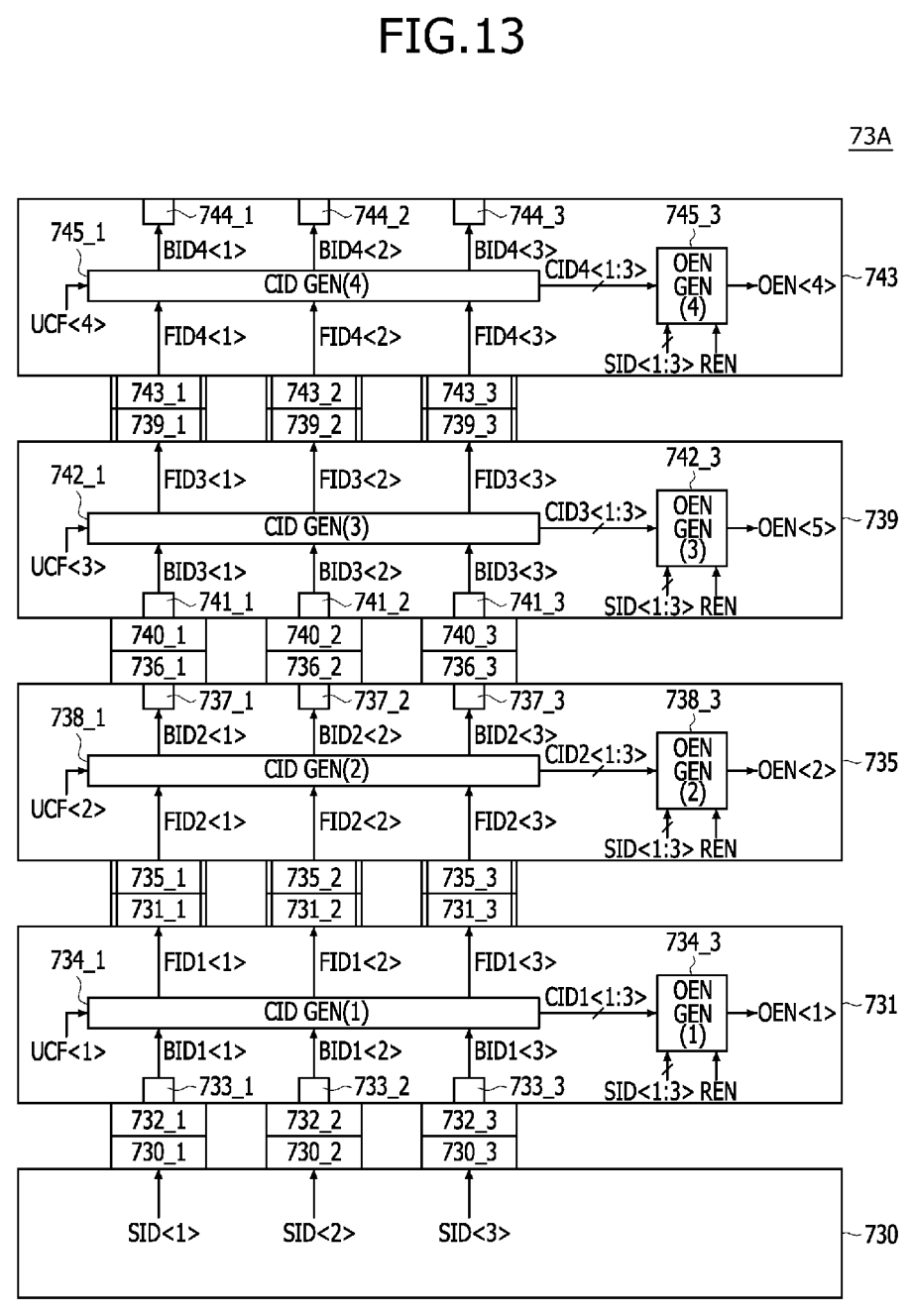

FIG. 13 is a diagram illustrating a construction of an output control module 73A according to an example of the present disclosure. As illustrated in FIG. 13, the output control module 73A may include a source control module 730, a first chip output control module 731, a second chip output control module 735, a third chip output control module 739, and a fourth chip output control module 743.

The source control module 730 may include a source control pad set 730_1, 730_2, and 730_3. The source control module 730 may receive selection IDs SID<1:3> and may output the selection IDs SID<1:3> to the source control pad set 730_1, 730_2, and 730_3. More specifically, the source control module 730 may output the first bit SID<1> of the selection ID SID to the source control pad 730_1, may output the second bit SID<2> of the selection ID SID to the source control pad 730_2 and may output the third bit SID<3> of the selection ID SID to the source control pad 730_3.

The first chip output control module 731 may include a first front control pad set 731_1, 731_2, and 731_3, a first back control pad set 732_1, 732_2, and 732_3, a first control through via set 733_1, 733_2, and 733_3, a first chip ID generation circuit (CID GEN(1)) 734_1, and a first output control signal generation circuit (OEN GEN(1)) 734_3. The front control pads of the first front control pad set 731_1, 731_2, and 731_3 may be bonded to the front control pads of a second front control pad set 735_1, 735_2, and 735_3 that are included in the second chip output control module 735, respectively. Control through vias that are included in the first control through via set 733_1, 733_2, and 733_3 may be connected to the back control pads of the first back control pad set 732_1, 732_2, and 732_3, respectively. The first chip ID generation circuit 734_1 may receive first back IDs BID1<1:3> through the first control through via set 733_1, 733_2, and 733_3. The first chip ID generation circuit 734_1 may generate first chip IDs CID1<1:3> and first front IDs FID1<1:3> from the first back IDs BID1<1:3> through a first path that is configured based on the first bit UCF<1> of the chip flag UCF. The first back IDs BID1<1:3> may be set as the same logic bit set as the selection IDs SID<1:3> and the first chip IDs CID1<1:3> may be set as the same logic bit set as the first back IDs BID1<1:3>. However, this is merely an embodiment and the present disclosure is not limited thereto. The first front IDs FID1<1:3> may be generated by counting the first back IDs BID1<1:3>. For example, when a logic bit set of the first back IDs BID1<1:3> is "000", a logic bit set of the first front IDs FID1<1:3> may be set as "001" that is up-counted by 1 bit. The first output control signal generation circuit 734_3 may receive the first chip IDs CID1<1:3> from the first chip ID generation circuit 734_1. The first output control signal generation circuit 734_3 may generate a first bit OEN<1> of the output control signal OEN that is activated when the first chip IDs CID1<1:3> and the selection IDs SID<1:3> are set as the same logic bit set. The first chip output control module 731 may be included in the first chip (23 in FIG. 4, 43 in FIG. 8, 53 in FIG. 9, or 63 in FIG. 10).

The second chip output control module 735 may include the second front control pad set 735_1, 735_2, and 735_3, a second back control pad set 736_1, 736_2, and 736_3, a second control through via set 737_1, 737_2, and 737_3, a second chip ID generation circuit (CID GEN(2)) 738_1, and a second output control signal generation circuit (OEN GEN(2)) 738_3. The back control pads of the second back control pad set 736_1, 736_2, and 736_3 may be bonded to the back control pads of a third back control pad set 740_1, 740_2, and 740_3 that are included in the third chip output control module 739, respectively. Control through vias that are included in the second control through via set 737_1, 737_2, and 737_3 may be connected to the back control pads of the second back control pad set 736_1, 736_2, and 736_3, respectively. The second chip ID generation circuit 738_1 may receive second front IDs FID2<1:3> through the second front control pad set 735_1, 735_2, and 735_3. The first chip ID generation circuit 734_1 may generate second chip IDs CID2<1:3> and second front IDs BID2<1:3> from the second front IDs FID2<1:3> through a second path that is configured based on the second bit UCF<2> of the chip flag UCF. The second front IDs FID2<1:3> may be set as the same logic bit set as the first front IDs FID1<1:3> and the second chip IDs CID2<1:3> may be set as the same logic bit set as the second front IDs FID2<1:3>. However, this is merely an embodiment and the present disclosure is not limited thereto. The second back IDs BID2<1:3> may be generated by counting the second front IDs FID2<1:3>. For example, when a logic bit set of the second front IDs FID2<1:3> is set "001", a logic bit set of the second back IDs BID2<1:3> may be set as "010" that is up-counted by 1 bit. The second output control signal generation circuit 738_3 may receive the second chip IDs CID2<1:3> from the second chip ID generation circuit 738_1. The second output control signal generation circuit 738_3 may generate a second bit OEN<2> of the output control signal OEN that is activated when the second chip IDs CID2<1:3> and the selection IDs SID<1:3> are set as the same logic bit set. The second chip output control module 735 may be included in the second chip (25 in FIG. 4, in FIG. 8, 55 in FIG. 9, or 65 in FIG. 10).

The third chip output control module 739 may include a third front control pad set 739_1, 739_2, and 739_3, the third back control pad set 740_1, 740_2, and 740_3, a third control through via set 741_1, 741_2, and 741_3, a third chip ID generation circuit (CID GEN(3)) 742_1, and a third output control signal generation circuit (OEN GEN (3)) 742_3. The front control pads of the third front control pad set 739_1, 739_2, and 739_3 may be bonded to the front control pads of a fourth front control pad set 743_1, 743_2, and 743_3 that are included in the fourth chip output control module 743, respectively. Control through vias that are included in the third control through via set 741_1, 741_2, and 741_3 may be connected to the back control pads of the third back control pad set 740_1, 740_2, and 740_3, respectively. The third chip ID generation circuit 742_1 may receive third back IDs BID3<1:3> through the third control through via set 741_1, 741_2, and 741_3. The third chip ID generation circuit 742_1 may generate third chip IDs CID3<1:3> and third front IDs FID3<1:3> from the third back IDs BID3<1:3> through a first path that is configured based on a third bit UCF<3> of the chip flag UCF. The third back IDs BID3<1:3> may be set as the same logic bit set as the second back IDs BID2<1:3> and the third chip IDs CID3<1:3> may be set as the same logic bit set as the third back IDs BID3<1:3>, but this is merely an embodiment and the present disclosure is not limited thereto. The third front IDs FID3<1:3> may be generated by counting the third back IDs BID3<1:3>. For example, when a logic bit set of the third back IDs BID3<1:3> is "010", a logic bit set of the third front IDs FID3<1:3> may be set as "011" that is up-counted by 1 bit. The third output control signal generation circuit 742_3 may receive the third chip IDs CID3<1:3> from the third chip ID generation circuit 742_1. The third output control signal generation circuit 742_3 may generate a third bit OEN<3> of the output control signal OEN that is activated when the third chip IDs CID3<1:3> and the selection IDs SID<1:3> are set as the same logic bit set. The third chip output control module 739 may be included in the third chip (27 in FIG. 4, 47 in FIG. 8, 57 in FIG. 9, or 67 in FIG. 10).

The fourth chip output control module 743 may include the fourth front control pad set 743_1, 743_2, and 743_3, a fourth control through via set 744_1, 744_2, and 744_3, a fourth chip ID generation circuit (CID GEN(4)) 745_1, and a fourth output control signal generation circuit (OEN GEN(4)) 745_3. The fourth chip ID generation circuit 745_1 may receive fourth front IDs FID4<1:3> through the fourth front control pad set 743_1, 743_2, and 743_3. The fourth chip ID generation circuit 745_1 may generate fourth chip IDs CID4<1:3> and fourth back IDs BID4<1:3> from the fourth front IDs FID4<1:3> through a second path that is configured based on a fourth bit UCF<4> of the chip flag UCF. The fourth front IDs FID4<1:3> may be set as the same logic bit set as the third front ID FID3<1:3> and the fourth chip IDs CID4<1:3> may be set as the same logic bit set as the fourth front IDs FID4<1:3>. However, this is merely an embodiment and the present disclosure is not limited thereto. The fourth back IDs BID4<1:3> may be generated by counting the fourth front IDs FID4<1:3>. For example, when a logic bit set of the fourth front IDs FID4<1:3> is "011", a logic bit set of the fourth back IDs BID4<1:3> may be set as "100" that is up-counted by 1 bit. The fourth output control signal generation circuit 745_3 may receive the fourth chip IDs CID4<1:3> from the fourth chip ID generation circuit 745_1. The fourth output control signal generation circuit 745_3 may generate a fourth bit OEN<4> of the output control signal OEN that is activated when the fourth chip IDs CID4<1:3> and the selection IDs SID<1:3> are set as the same logic bit set. The fourth chip output control module 743 may be included in the fourth chip (29 in FIG. 4, 49 in FIG. 8, 59 in FIG. 9, or 69 in FIG. 10).

Figure 14:
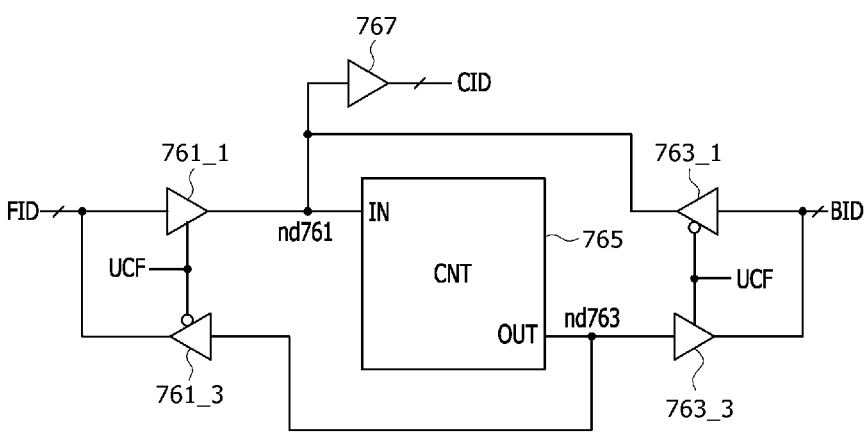
FIG. 14 is a diagram illustrating a construction of a chip ID generation circuit according to an example of the present disclosure.

FIG. 14 is a diagram illustrating a construction of a chip ID generation circuit 76 according to an example of the present disclosure. As illustrated in FIG. 14, the chip ID generation circuit 76 may include a first ID input driver 761_1, a first ID output driver 761_3, a second ID input driver 763_1, a second ID output driver 763_3, a counter (CNT) 765, and a third ID output driver 767. The first ID input driver 761_1 may drive an input node nd761 based on a front ID FID when the chip flag UCF is set to a logic high level in each of the upper chips (13 in FIGS. 2 and 3, 25 and 29 in FIGS. 4, 45 and 49 in FIGS. 8, 55 and 59 in FIGS. 9, and 65 and 69 in FIG. 10). The first ID input driver 761_1 may deliver the front ID FID to the input node nd761 in each of the upper chips. The first ID output driver 761_3 may drive the front ID FID based on a signal of an output node nd763 when the chip flag UCF is set to a logic low level in each of the lower chips (11 in FIGS. 1 and 3, 23 and 27 in FIGS. 4, 43 and 47 in FIGS. 8, 53 and 57 in FIGS. 9, and 63 and 67 in FIG. 10). The first ID output driver 761_3 may deliver the signal of the output node nd763 as the front ID FID in each of the lower chips. The second ID input driver 763_1 may drive the input node nd761 based on the back ID BID when the chip flag UCF is set to a logic low level in each of the lower chips. The second ID input driver 763_1 may deliver the back ID BID to the input node nd761 in each of the lower chips. The second ID output driver 763_3 may drive the back ID BID based on a signal of the output node nd763 when the chip flag UCF is set to a logic high level in each of the upper chips. The second ID output driver 763_3 may deliver a signal of the output node nd763 as the back ID BID in each of the upper chips. The counter 765 may count a signal of the input node nd761 and output the signal to the output node nd763. The third ID output driver 767 may drive the chip ID CID based on the signal of the input node nd761. The third ID output driver 767 may deliver the signal of the input node nd761 as the chip ID CID.

The chip ID generation circuit 76 may be used to implement the first chip ID generation circuit 734_1, the second chip ID generation circuit 738_1, the third chip ID generation circuit 742_1, and the fourth chip ID generation circuit 745_1 illustrated in FIG. 13. For example, when the first chip ID generation circuit 734_1 is implemented by using the chip ID generation circuit 76, the chip flag UCF and the back ID BID input to the chip ID generation circuit 76 may be set as the first bit UCF<1> of the chip flag UCF and the first back IDs BID1<1:3>, respectively, and the chip ID CID and the front ID FID output by the chip ID generation circuit 76 may be set as the first chip IDs CID1<1:3> and the first front IDs FID1<1:3>, respectively. Furthermore, for example, when the second chip ID generation circuit 738_1 is implemented by using the chip ID generation circuit 76, the chip flag UCF and the front ID FID input to the chip ID generation circuit 76 may be set as the second bit UCF<2> of the chip flag UCF and the second front IDs FID2<1:3>, respectively, and the chip ID CID and the back ID BID output by the chip ID generation circuit 76 may be set as the first chip IDs CID1<1:3> and the second back IDs BID2<1:3>, respectively.

An operation of the chip ID generation circuit 76 constructed as described above is described with reference to FIGS. 15 and 16. In this case, a case where the chip flag UCF is set to a logic low level in each of the lower chips and a case where the chip flag UCF is set to a logic high level in each of the upper chips are divided and described.

Figure 15:
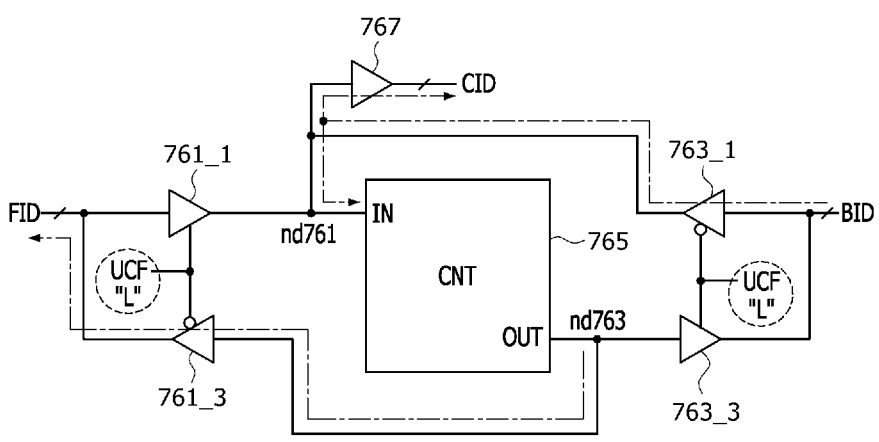
FIGS. 15 and 16 are diagrams for describing an operation of a chip ID generation circuit according to an example of the present disclosure.

As illustrated in FIG. 15, when the chip flag UCF is set to a logic low level "L" in each of the lower chips, the chip ID generation circuit 76 may generate the chip ID CID from the back ID BID through the first path and may generate the front ID FID by counting the back ID BID. The first path may include a path in which the second ID input driver 763_1 drives the input node nd761 from the back ID BID, a path in which the third ID output driver 767 delivers a signal of the input node nd761 as the chip ID CID, a path in which the counter 765 counts the signal of the input node nd761 and outputs the signal to the output node nd763, and a path in which the first ID output driver 761_3 drives the front ID FID from the signal of the output node nd763.

Figure 16:
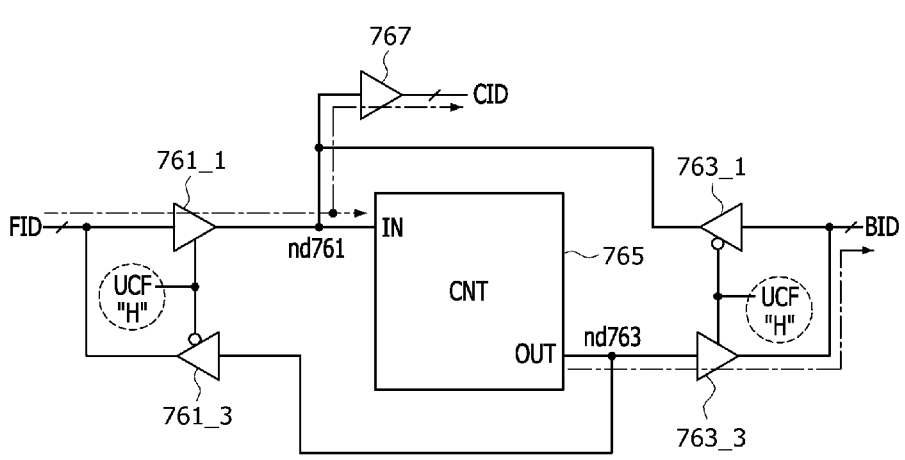

As illustrated in FIG. 16, when the chip flag UCF is set to a logic high level "H" in each of the upper chips, the chip ID generation circuit 76 may generate the chip ID CID from the front ID FID through the second path and may generate the back ID BID by counting the front ID FID. The second path may include a path in which the first ID input driver 761_1 drives the input node nd761 from the front ID FID, a path in which the third ID output driver 767 delivers a signal of the input node nd761 as the chip ID CID, a path in which the counter 765 counts the signal of the input node nd761 and outputs the signal to the output node nd763, and a path in which the second ID output driver 763_3 drives the back ID BID from the signal of the output node nd763.

Figure 17:
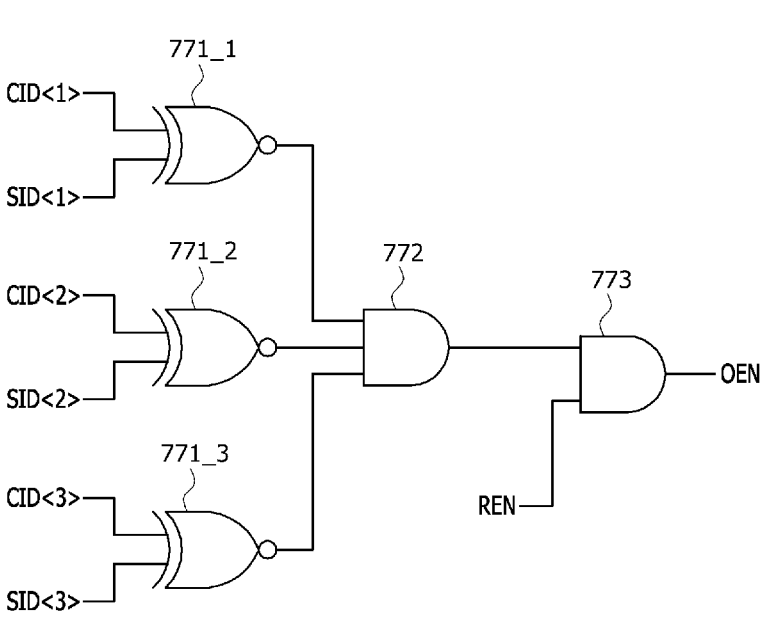
FIG. 17 is a diagram illustrating an output control signal generation circuit according to an example of the present disclosure.

FIG. 17 is a diagram illustrating an output control signal generation circuit 77 according to an example of the present disclosure. As illustrated in FIG. 17, the output control signal generation circuit 77 may include XNOR operation elements 771_1 to 771_3 and AND operation elements 772 and 773. The XNOR operation element 771_1 may perform an XNOR operation on a first bit CID<1> of the chip ID CID and a first bit SID<1> of the selection ID SID. The XNOR operation element 771_2 may perform an XNOR operation on a second bit CID<2> of the chip ID CID and a second bit SID<2> of the selection ID SID. The XNOR operation element 771_3 may perform an XNOR operation on a third bit CID<3> of the chip ID CID and a third bit SID<3> of the selection ID SID. The AND operation element 772 may perform an AND operation on output signals of the respective XNOR operation elements 771_1 to 771_3. The AND operation element 773 may perform an AND operation on an output signal of the AND operation element 772 and a read control signal REN. The read control signal REN may be activated to a logic high level in a read operation. The output control signal generation circuit 77 may generate the output control signal OEN that is activated to a logic high level when the first bit CID<1> of the chip ID CID, the second bit CID<2> of the chip ID CID, and the third bit CID<3> of the chip ID CID are the same as the first bit SID<1> of the selection ID SID, the second bit SID<2> of the selection ID SID, and the third bit SID<3> of the selection ID SID, respectively, in a read operation. The output control signal generation circuit 77 may generate the output control signal OEN that is activated in order to output the internal data DIN when the selection IDs SID<1:3> having the same logic bit set as the chip IDs CID<1:3> are input in a read operation.

The output control signal generation circuit 77 may be used to implement the first output control signal generation circuit 734_3, the second output control signal generation circuit 738_3, the third output control signal generation circuit 742_3, and the fourth output control signal generation circuit 745_3, illustrated in FIG. 13. For example, when the first output control signal generation circuit 734_3 is implemented by using the output control signal generation circuit 77, the chip IDs CID<1:3> that is input to the output control signal generation circuit 77 may be set as the first chip IDs CID1<1:3>, and the output control signal OEN that is output by the output control signal generation circuit 77 may be set as a first output control signal OEN1. Furthermore, for example, when the second output control signal generation circuit 738_3 is implemented by using the output control signal generation circuit 77, the chip IDs CID<1:3> that is input to the output control signal generation circuit 77 may be set as the second chip IDs CID2<1:3>, and the output control signal OEN that is output by the output control signal generation circuit 77 may be set as a second output control signal OEN2.

Figure 18:
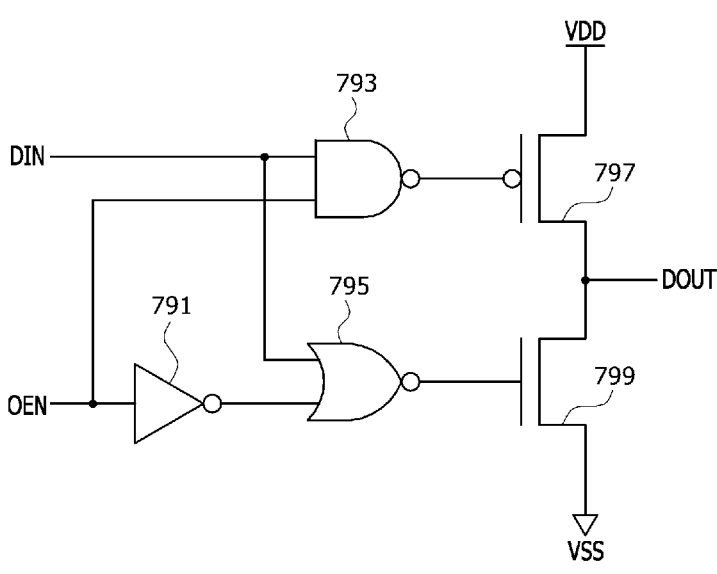
FIG. 18 is a diagram illustrating a data output module according to an example of the present disclosure.

FIG. 18 is a diagram illustrating a data output module 79A according to an example of the present disclosure. As illustrated in FIG. 18, the data output module 79A may include an inverter 791, a NAND operation element 793, a NOR operation element 795, a PMOS transistor 797, and an NMOS transistor 799. The inverter 791 may invert and buffer the output control signal OEN. The NAND operation element 793 may perform a NAND operation on the internal data DIN and the output control signal OEN. The NOR operation element 795 may perform a NOR operation on the internal data DIN and an output signal of the inverter 791. The PMOS transistor 797 may be turned on in response to an output signal of the NAND operation element 793 and may drive the output data DOUT by the power supply voltage VDD. The NMOS transistor 799 may be turned on in response to an output signal of the NOR operation element 795 and may drive the output data DOUT by the ground voltage VSS. The data output module 79A may drive the output data DOUT based on a logic level of the internal data DIN when the output control signal OEN is activated to a logic high level in a read operation. For example, when the NMOS transistor 799 is turned on by the NOR operation element 795 that outputs a logic high level when the level of the internal data DIN is at a logic low level in the state in which the output control signal OEN has been activated to a logic high level, the data output module 79A may drive the output data DOUT to a logic low level. Furthermore, for example, when the PMOS transistor 797 is turned on by the NAND operation element 793 that outputs a logic low level when the level of the internal data DIN is at a logic high level in the state in which the output control signal OEN has been activated to a logic high level, the data output module 79A may drive the output data DOUT to a logic high level.

Figure 19:
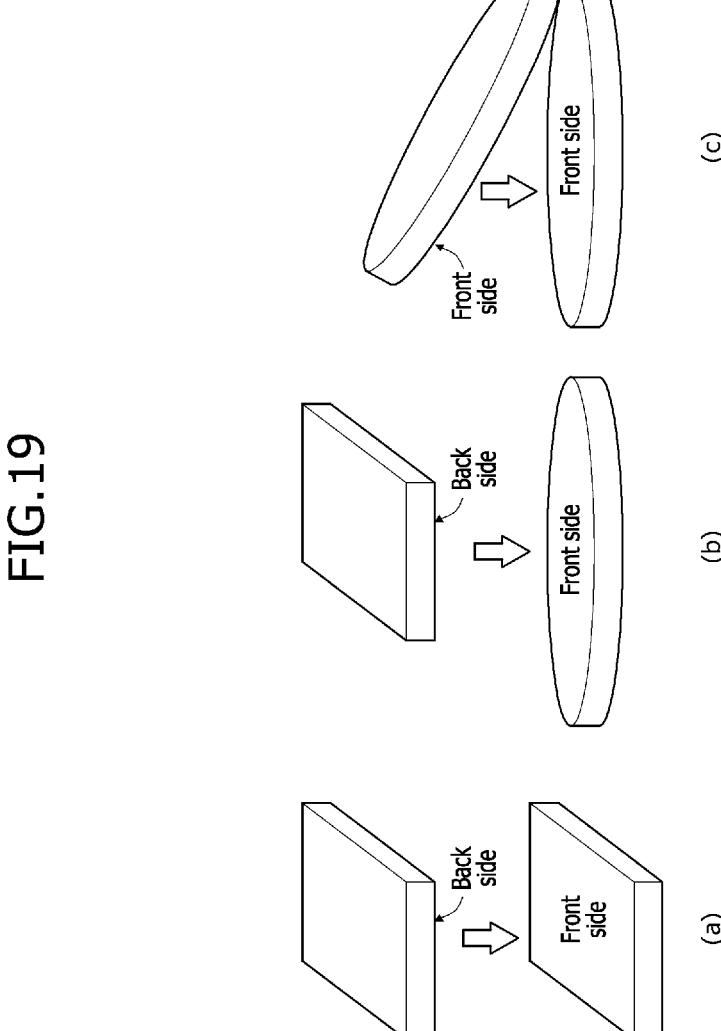
FIG. 19 is a diagram for describing a connection structure for a chip and a wafer.

FIG. 19 is a diagram for describing a connection structure for a chip and a wafer. As illustrated in FIG. 19, the connection structure for a chip and a wafer may include a method of stacking the back side of a chip on the front side of a chip so that the back side of the chip and the front side of the chip face each other as illustrated in (a), a method of stacking the back side of a chip on the front side of a wafer so that the back side of the chip and the front side of the wafer face each other as illustrated in (b), and a method of stacking the front side of a wafer on the front side of a wafer so that the front side of the wafer and the front side of the wafer face each other as illustrated in (c). As illustrated in (c), a front face to front face bonding structure may be formed by the method of stacking the front side of a wafer on the front side of a wafer so that the front side of the wafer and the front side of the wafer face each other.

The stacked integrated circuit 15 described above with reference to FIG. 3, the stacked integrated circuit 20 described with reference to FIG. 4, the stacked integrated circuit 35 described with reference to FIG. 7, the stacked integrated circuit 40 described with reference to FIG. 8, the stacked integrated circuit 50 described with reference to FIG. 9, the stacked integrated circuit 60 described with reference to FIG. 10, or the stacked integrated circuit 7 described with reference to FIG. 11 may be applied to an electronic system, which include a memory system, a graphic system, a computing system, a mobile system, etc. For example, referring to FIG. 20, an electronic system 1000 according to an embodiment of the present disclosure may include a data storage unit 1001, a memory controller 1002, a buffer memory 1003, and an input and output (I/O) interface 1004.

The data storage unit 1001 may store data (not illustrated) applied by the memory controller 1002 in response to a control signal from the memory controller 1002, may read the stored data (not illustrated), and may output the read data to the memory controller 1002. The data storage unit 1001 may include a non-volatile memory capable of continuously retaining stored data without receiving power. The non-volatile memory may be implemented as a flash memory (a NOR flash memory, a NAND flash memory), a phase change random access memory (PRAM), a resistive random access memory (RRAM), a spin transfer torque random access memory (STTRAM), or a magnetic random access memory (MRAM).

Figure 20:
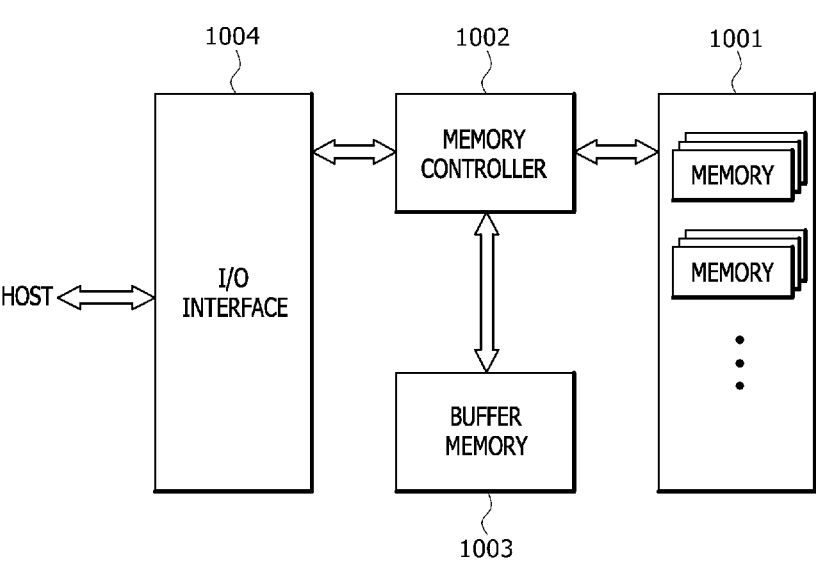
FIG. 20 is a block diagram illustrating a construction of an electronic system according to an example of the present disclosure.

The memory controller 1002 may decode an instruction applied by an external device (host device) through the I/O interface 1004 and may control data I/O for the data storage unit 1001 and the buffer memory 1003 based on a result of the decoding. In FIG. 20, the memory controller 1002 has been illustrated as one block, but a controller to control the data storage unit 1001 and a controller to control the buffer memory 1003, that is, a volatile memory, may be constructed independently of the memory controller 1002.

The buffer memory 1003 may temporarily store data to be processed by the memory controller 1002, that is, data (not illustrated) input to and output from the data storage unit 1001. The buffer memory 1003 may store data (not illustrated) that is applied by the memory controller 1002 in response to a control signal. The buffer memory 1003 may include the stacked integrated circuit 15 described with reference to FIG. 3, the stacked integrated circuit 20 described with reference to FIG. 4, the stacked integrated circuit 35 described with reference to FIG. 7, the stacked integrated circuit 40 described with reference to FIG. 8, the stacked integrated circuit 50 described with reference to FIG. 9, the stacked integrated circuit 60 described with reference to FIG. 10, or the stacked integrated circuit 7 described with reference to FIG. 11. The buffer memory 1003 may read data stored therein and may output the read data to the memory controller 1002. The buffer memory 1003 may include a volatile memory, such as a dynamic random access memory (DRAM), a mobile DRAM, or a static random access memory (SRAM).

The I/O interface 1004 may provide a physical connection between the memory controller 1002 and the external device (host) so that the memory controller 1002 can receive a control signal for data I/O from the external device and exchange data with the external device. The I/O interface 1004 may include one of various interface protocols, such as a USB, MMC, PCI-E, SAS, SATA, PATA, an SCSI, ESDI, and IDE.

The electronic system 1000 may be used as an auxiliary memory device or external storage device of a host device. The electronic system 1000 may include a solid state disk (SSD), a universal serial bus memory (USB memory), a secure digital (SD) card, a mini secure digital (mSD) card, a micro SD, a secure digital high capacity (SDHC), a memory stick card, a smart media card (SM), a multi media card (MMC), an embedded MMC (eMMC), a compact flash (CF) card, etc.

Figure 21:
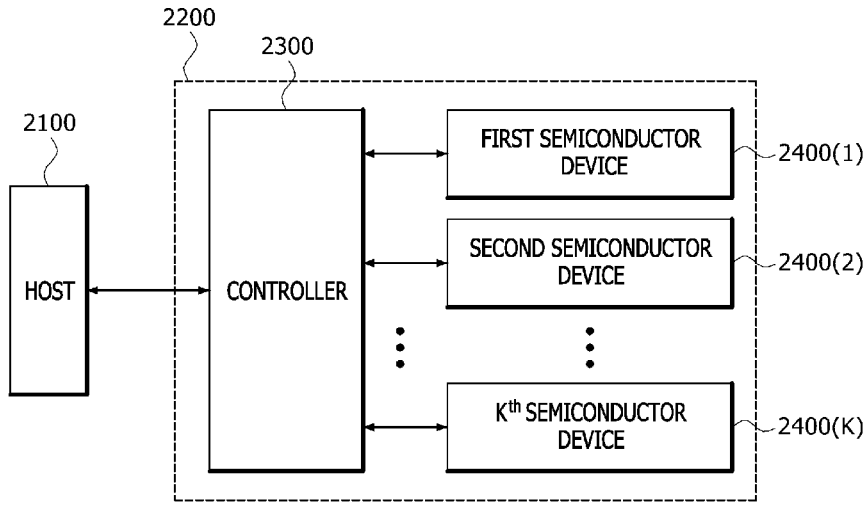
FIG. 21 is a block diagram illustrating a construction of an electronic system according to another example of the present disclosure.

FIG. 21 is a block diagram illustrating a construction of an electronic system 2000 according to another embodiment of the present disclosure. As illustrated in FIG. 21, the electronic system 2000 may include a host 2100 and a semiconductor system 2200.

The host 2100 and the semiconductor system 2200 may mutually transmit signals by using an interface protocol. The interface protocol that is used between the host 2100 and the semiconductor system 2200 may include a multi-media card (MMC), an enhanced small disk interface (ESDI), integrated drive electronics (IDE), a peripheral component interconnect-express (PCI-E), advanced technology attachment (ATA), serial ATA (SATA), parallel ATA (PATA), a serial attached SCSI (SAS), a universal serial bus (USB), etc.

Each of semiconductor devices 2400(K:1) may include the stacked integrated circuit 15 described with reference to FIG. 3, the stacked integrated circuit 20 described with reference to FIG. 4, the stacked integrated circuit 35 described with reference to FIG. 7, the stacked integrated circuit 40 described with reference to FIG. 8, the stacked integrated circuit 50 described with reference to FIG. 9, the stacked integrated circuit 60 described with reference to FIG. 10, or the stacked integrated circuit 7 described with reference to FIG. 11. Each of the semiconductor devices 2400(K:1) may be implemented as one of a dynamic random access memory (DRAM), a phase change random access memory (PRAM), a resistive random access memory (PRAM), a magnetic random access memory (MRAM), and a ferroelectric random access memory (FRAM).

The present disclosure has been described so far based on the embodiments. A person having ordinary knowledge in the art to which the present disclosure pertains will understand that the present disclosure may be implemented in a modified form without departing from the intrinsic characteristics of the present disclosure. Accordingly, the disclosed embodiments should be considered from a descriptive viewpoint, not a limitative viewpoint. The scope of the present disclosure are disclosed in the claims, not the aforementioned description, and all differences within an equivalent range thereof should be construed as being included in the present disclosure.

What is claimed is:

1. A stacked integrated circuit comprising:
   a first chip comprising a first through via set disposed symmetrical to a second through via set in relation to a first rotating axis and comprising a first input and output (IO) circuit disposed asymmetrical to a second IO circuit in relation to the first rotating axis; and
   a second chip comprising a third through via set disposed symmetrical to a fourth through via set in relation to a second rotating axis and comprising a third IO circuit disposed asymmetrical to a fourth IO circuit in relation to the second rotating axis,
   wherein the second chip is rotated around the second rotating axis and stacked on the first chip.

2. The stacked integrated circuit of claim 1, wherein data or a control signal is input or output, a power supply voltage is supplied, or a ground voltage is supplied through each through via of the first through via set, the second through via set, the third through via set, and the fourth through via set.

3. The stacked integrated circuit of claim 1, wherein:
   the first through via set comprises a first through via and a second through via,
   the second through via set comprises a third through via and a fourth through via,
   the first through via is disposed symmetrical to the fourth through via in relation to the first rotating axis, and
   the second through via is disposed symmetrical to the third through via in relation to the first rotating axis.

4. The stacked integrated circuit of claim 3, wherein:
   the first IO circuit is connected to a first front pad to which the first through via is connected, and
   the second IO circuit is connected to a second front pad to which the third through via is connected.

5. The stacked integrated circuit of claim 4, wherein:
   the third through via set comprises a fifth through via and a sixth through via,
   the fourth through via set comprises a seventh through via and an eighth through via,
   the fifth through via is disposed symmetrical to the eighth through via in relation to the second rotating axis, and
   the sixth through via is disposed symmetrical to the seventh through via in relation to the second rotating axis.

6. The stacked integrated circuit of claim 5, wherein:
   the third IO circuit is connected to a third front pad to which the fifth through via is connected, and
   the fourth IO circuit is connected to a fourth front pad to which the seventh through via is connected.

7. The stacked integrated circuit of claim 6, wherein:
   the eighth through via is disposed over the first through via,
   the seventh through via is disposed over the second through via,
   the sixth through via is disposed over the third through via, and
   the fifth through via is disposed over the fourth through via.

8. A stacked integrated circuit comprising:
   a first chip comprising a first through via connected to a first front pad and a second through via connected to a second front pad and comprising a first input and output (IO) circuit that is connected to the first front pad and that inputs and outputs data or control signals through a first channel; and
   a second chip comprising a third through via connected to a third front pad and a fourth through via connected to a fourth front pad and comprising a second IO circuit that is connected to the fourth front pad and that inputs and outputs data or control signals through a second channel, the first chip bonded to the second chip by bonding the first front pad to the third front pad and bonding the second front pad to the fourth front pad.

9. The stacked integrated circuit of claim 8, wherein:
   the first chip further comprises a fifth through via connected to a fifth front pad, a sixth through via connected to a sixth front pad, and a third IO circuit connected to the fifth front pad,
   the second through via and the fifth through via are disposed to be symmetrical to each other based on the rotating axis, and
   the second through via is disposed symmetrical to the fifth through via based on the rotating axis, and
   the first through via and the sixth through via are disposed to be symmetrical to each other based on the rotating axis,
   the first through via is disposed symmetrical to the sixth through via based on the rotating axis.

10. The stacked integrated circuit of claim 9, wherein:
   the second chip further comprises a seventh through via connected to a seventh front pad, an eighth through via connected to an eighth front pad, and a fourth IO circuit connected to the eighth front pad,
   the fourth through via disposed symmetrical to the seventh through via based on the rotating axis, and the third through via disposed symmetrical to the eighth through via based on the rotating axis.

11. The stacked integrated circuit of claim 10, wherein:

the fifth front pad and the seventh front pad are bonded together, and the sixth front pad and the eighth front pad are bonded together.

12. The stacked integrated circuit of claim 10, wherein:

the first IO circuit and the third IO circuit are formed as a first rank, the second IO circuit and the fourth IO circuit are formed as the first rank, each of the first IO circuit and the third IO circuit inputs and outputs data or control signals through a first channel, and each of the second IO circuit and the fourth IO circuit inputs and outputs the data or control signals through a second channel.

13. The stacked integrated circuit of claim 8, further comprising:

a third chip comprising a fifth through via connected to a fifth front pad, a sixth through via connected to a sixth front pad, and a third IO circuit connected to the fifth front pad; and a fourth chip comprising a seventh through via connected to a seventh front pad, an eighth through via connected to an eighth front pad, and a fourth IO circuit connected to the eighth front pad, wherein the fifth front pad is bonded to the seventh front pad, and wherein the sixth front pad is bonded to the eighth front pad.

14. The stacked integrated circuit of claim 13, wherein:

each of the first IO circuit and the second IO circuit is formed as a first rank, each of the third IO circuit and the fourth IO circuit is formed as a second rank, each of the first IO circuit and the third IO circuit inputs and outputs data or control signals through a first channel, and each of the second IO circuit and the fourth IO circuit inputs and outputs the data or control signals through a second channel.

15. A stacked integrated circuit comprising:

a first chip comprising a first through via disposed symmetrical to a second through via in relation to a first rotating axis and comprising a first input and output (IO) circuit connected to a first front pad to which the first through via is connected; and a second chip comprising a third through via disposed symmetrical to a fourth through via in relation to a second rotating axis and comprising a second IO circuit connected to a second front pad to which the third through via is connected, wherein the second chip is rotated around the second rotating axis and stacked on the first chip.

16. The stacked integrated circuit of claim 15, wherein data or control signals are input to and output through each of the first through via, the second through via, the third through via, and the fourth through via.

17. The stacked integrated circuit of claim 15, wherein:

the fourth through via is disposed over the first through via, and the third through via is disposed over the second through via.

18. A stacked integrated circuit comprising:

a first chip comprising a first through via connected to a first front pad, a second through via connected to a second front pad, and a first input and output (IO) circuit connected to the first front pad; and a second chip comprising a third through via connected to a third front pad, a fourth through via connected to a fourth front pad, and a second IO circuit connected to the fourth front pad, wherein the first through via is disposed symmetrical to the second through via based on a rotating axis, the third through via is disposed symmetrical to the fourth through via based on the rotating axis, the first front pad is bonded to the third front pad, and the second front pad is bonded to the fourth front pad.

19. The stacked integrated circuit of claim 18, wherein:

the first IO circuit is formed as a first rank, inputting and outputting data or control signals through a first channel, and the second IO circuit is formed as the first rank, inputting and outputting the data or control signals through a second channel.

20. The stacked integrated circuit of claim 18, further comprising:

a third chip comprising a fifth through via connected to a fifth front pad, a sixth through via connected to a sixth front pad, and a third IO circuit connected to the fifth front pad; and a fourth chip comprising a seventh through via connected to a seventh front pad, an eighth through via connected to an eighth front pad, and a fourth IO circuit connected to the eighth front pad, wherein the fifth through via is disposed symmetrical to the sixth through via based on the rotating axis, the seventh through via is disposed symmetrical to the eighth through via based on the rotating axis, the fifth front pad is bonded to the seventh front pad, and the sixth front pad is bonded to the eighth front pad.

21. The stacked integrated circuit of claim 20, wherein:

each of the first IO circuit and the second IO circuit is formed as a first rank, each of the third IO circuit and the fourth IO circuit is formed as a second rank, each of the first IO circuit and the third IO circuit inputs and outputs data or control signals through a first channel, and each of the second IO circuit and the fourth IO circuit inputs and outputs the data or control signals through a second channel.

22. A stacked integrated circuit comprising:

a first bonding chip formed by stacking a first chip comprising a first input and output (IO) circuit and a second chip comprising a second IO circuit;

a dummy chip stacked on the first bonding chip; and a second bonding chip stacked on the dummy chip and formed by stacking a third chip comprising a third IO circuit and a fourth chip comprising a fourth IO circuit, wherein the dummy chip comprises a dummy via set, a first dummy pad set, and a second dummy pad set, each of which is connected such that each of the first IO circuit, the second IO circuit, the third IO circuit, and the fourth IO circuit is allocated to a separate channel.

23. The stacked integrated circuit of claim 22, wherein a configuration of dummy vias of the dummy via set connected to dummy pads of the first dummy pad set is different from a configuration of the dummy vias of the dummy via set connected to dummy pads of the second dummy pad set.

24. The stacked integrated circuit of claim 22, wherein:

the first IO circuit inputs and outputs data or control signals through a first channel, the second IO circuit inputs and outputs the data or control signals through a second channel, the third IO circuit inputs and outputs the data or control signals through a third channel, and the fourth IO circuit inputs and outputs the data or control signals through a fourth channel.

25. The stacked integrated circuit of claim 22, wherein:

the first chip comprises a first through via connected to a first front pad and a second through via connected to a second front pad, the second chip comprises a third through via connected to a third front pad and a fourth through via connected to a fourth front pad, and the first IO circuit is connected to the first front pad.

26. The stacked integrated circuit of claim 25, wherein:

the first front pad and the third front pad are bonded together, and the second front pad and the fourth front pad are bonded together.

27. The stacked integrated circuit of claim 25, wherein:

the dummy via set comprises a first dummy via and a second dummy via, the first dummy pad set comprises a first dummy pad and a second dummy pad, the first dummy via is connected to the first dummy pad, and the second dummy via is connected to the second dummy pad.

28. The stacked integrated circuit of claim 27, wherein:

the third through via is connected to a first back pad, the fourth through via is connected to a second back pad, the first back pad and the first dummy pad are bonded together, and the second back pad and the second dummy pad are bonded together.

29. The stacked integrated circuit of claim 28, wherein:

the third chip comprises a fifth through via connected to a fifth front pad and a sixth through via connected to a sixth front pad, and the third IO circuit is connected to the fifth front pad.

30. The stacked integrated circuit of claim 29, wherein:

the fifth through via is connected to a third back pad, the sixth through via is connected to a fourth back pad, the second dummy pad set comprises a third dummy pad and a fourth dummy pad, the first dummy via is connected to the fourth dummy pad, the second dummy via is connected to the third dummy pad, the third back pad is bonded to the third dummy pad, and the fourth back pad is bonded to the fourth dummy pad.

31. The stacked integrated circuit of claim 29, wherein:

the fourth chip comprises a seventh through via connected to a seventh front pad and an eighth through via connected to an eighth front pad, and the fifth front pad is bonded to the seventh front pad, and the sixth front pad is bonded to the eighth front pad.

32. A stacked integrated circuit comprising:

a first chip comprising a first front pad set, a first through via set, a first back pad set, and a first input and output (IO) circuit;

a second chip stacked on the first chip and comprising a second IO circuit;

a third chip stacked on the second chip and comprising a third IO circuit; and a fourth chip stacked on the third chip and comprising a fourth IO circuit, wherein the second chip comprises a second front pad set, a second through via set, and a second back pad set, each of which is connected such that each of the first IO circuit, the second IO circuit, the third IO circuit, and the fourth IO circuit is allocated to a separate channel.

33. The stacked integrated circuit of claim 32, wherein a configuration of through vias of the second through via set connected to front pads of the second front pad set is different from a configuration of the through vias of the second through via set connected to back pads of the second back pad set.

34. The stacked integrated circuit of claim 32, wherein:

the first IO circuit is allocated to a first channel, the second IO circuit is allocated to a second channel, the third IO circuit is allocated to a third channel, and the fourth IO circuit is allocated to a fourth channel.

35. The stacked integrated circuit of claim 32, wherein:

the first front pad set comprises a first front pad and a second front pad, the first through via set comprises a first through via connected to the first front pad and a second through via connected to the second front pad, the second front pad set comprises a third front pad and a fourth front pad, the second through via set comprises a third through via connected to the third front pad and a fourth through via connected to the fourth front pad, the first IO circuit is connected to the first front pad, the first front pad is bonded to the third front pad, and the second front pad is bonded to the fourth front pad.

36. The stacked integrated circuit of claim 35, wherein:

the second back pad set comprises a first back pad and a second back pad, the first back pad is connected to the fourth through via, and the second back pad is connected to the third through via.

37. The stacked integrated circuit of claim 36, wherein:

the third chip comprises a fifth through via connected to a third back pad and a sixth through via connected to a fourth back pad, the third IO circuit is connected to a fifth front pad to which the fifth through via is connected, the third back pad is connected to the first back pad, and the fourth back pad is connected to the second back pad.

38. A stacked integrated circuit comprising:

a chip flag module configured to generate a chip flag comprising information on whether a chip is a lower chip or an upper chip based on a source flag; and an output control module configured to generate a chip ID in a different path based on the chip flag and configured to generate an output control signal to control an output of chip data based on the chip ID, a selection ID, and a read control signal.

39. The stacked integrated circuit of claim 38, wherein:

the chip flag module comprises a first chip flag module and a second chip flag module, the first chip flag module is included in the lower chip, and the second chip flag module is included in the upper chip.

40. The stacked integrated circuit of claim 39, wherein:

the chip flag comprises a first chip flag and a second chip flag, the first chip flag module generates the first chip flag from an inverted signal of the source flag, and the second chip flag module generates the second chip flag from the source flag.

41. The stacked integrated circuit of claim 38, wherein:
the output control module comprises a first output control module and a second output control module,
the first output control module is included in the lower chip, and
the second output control module is included in the upper chip.

42. The stacked integrated circuit of claim 41, wherein the first output control module comprises a first chip ID generation circuit configured to generate a first chip ID in a first path based on a first chip flag.

43. The stacked integrated circuit of claim 42, wherein the first chip ID generation circuit comprises:
a first input driver configured to drive a first node from a first back ID based on the first chip flag;
a first chip ID driving circuit configured to drive the first chip ID from a signal of the first node;
a first counter configured to count the signal of the first node and configured to output the counted signal to a second node; and
a first output driver configured to drive a first front ID that is output through the first front pad set from the signal of the second node based on the first chip flag.

44. The stacked integrated circuit of claim 42, wherein the first output control module further comprises a first output control signal generation circuit configured to generate a first output control signal to control an output of first internal data based on the first chip ID, the selection ID, and the read control signal.

45. The stacked integrated circuit of claim 44, wherein the first output control signal generation circuit is configured to generate the first output control signal activated when the first chip ID and the selection ID are identical to each other in a state during which a read operation is performed and the read control signal is activated.

46. The stacked integrated circuit of claim 41, wherein the second output control module comprises a second chip ID generation circuit configured to generate a second chip ID in a second path based on a second chip flag.

47. The stacked integrated circuit of claim 46, wherein the second chip ID generation circuit comprises:
a second input driver configured to drive a first node from a second front ID based on the second chip flag;
a second chip ID driving circuit configured to drive the second chip ID from a signal of the first node;
a second counter configured to count the signal of the first node and configured to output the counted signal to a second node; and
a second output driver configured to drive a second back ID from the signal of the second node based on the second chip flag.

48. The stacked integrated circuit of claim 46, wherein the second output control module further comprises a second output control signal generation circuit configured to generate a second output control signal to control an output of second internal data based on the second chip ID, a selection ID, and a read control signal.

49. The stacked integrated circuit of claim 48, wherein the second output control signal generation circuit is configured to generate the second output control signal activated when the second chip ID and the selection ID are identical to each other in a state during which a read operation is performed and the read control signal is activated.

50. A stacked integrated circuit comprising:
a first chip comprising a first front pad set and a first back pad set and further comprising a first chip ID generation circuit configured to generate a first chip ID in a first path based on a first chip flag; and
a second chip comprising a second front pad set and a second back pad set and further comprising a second chip ID generation circuit configured to generate a second chip ID in a second path based on a second chip flag, the second chip being stacked on the first chip and bonded together by bonding the first front pad set to the second front pad set.

51. The stacked integrated circuit of claim 50, wherein the first chip further comprises a first chip flag module configured to generate the first chip flag from an inverted signal of a source flag.

52. The stacked integrated circuit of claim 50, wherein the second chip further comprises a second chip flag module configured to generate the second chip flag from a source flag.

53. The stacked integrated circuit of claim 50, wherein the first chip ID generation circuit comprises:
a first input driver configured to drive a first node from a first back ID that is received through the first back pad set based on the first chip flag;
a first chip ID driving circuit configured to drive the first chip ID from a signal of the first node;
a first counter configured to count the signal of the first node and configured to output the counted signal to a second node; and
a first output driver configured to drive a first front ID that is output through the first front pad set from the signal of the second node based on the first chip flag.

54. The stacked integrated circuit of claim 50, wherein the first chip further comprises a first output control signal generation circuit configured to generate a first output control signal to control an output of first internal data based on the first chip ID, a selection ID, and a read control signal.

55. The stacked integrated circuit of claim 54, wherein the first output control signal generation circuit is configured to generate the first output control signal activated when the first chip ID and the selection ID are identical to each other in a state during which a read operation is performed and the read control signal is activated.

56. The stacked integrated circuit of claim 50, wherein the second chip ID generation circuit comprises:
a second input driver configured to drive a first node from a second front ID that is received through the second front pad set based on the second chip flag;
a second chip ID driving circuit configured to drive the second chip ID from a signal of the first node;
a second counter configured to count the signal of the first node and configured to output the counted signal to the second node; and
a second output driver configured to drive a second back ID that is output through the second back pad set from the signal of the second node based on the second chip flag.

57. The stacked integrated circuit of claim 50, wherein the second chip further comprises a second output control signal generation circuit configured to generate a second output control signal to control an output of second internal data based on the second chip ID, a selection ID, and a read control signal.

58. The stacked integrated circuit of claim 57, wherein the second output control signal generation circuit is configured to generate the second output control signal activated when the second chip ID and the selection ID are identical to each other in a state during which a read operation is performed and the read control signal is activated.

\* \* \* \* \*